US012719718B2

(12) United States Patent
Chen et al.

(10) Patent No.: US 12,719,718 B2
(45) Date of Patent: Aug. 25, 2026

(54) COMMUNICATION METHOD AND APPARATUS

(71) Applicant: HUAWEI TECHNOLOGIES CO., LTD., Shenzhen (CN)

(72) Inventors: Jiaxuan Chen, Shanghai (CN); Haicun Hang, Shanghai (CN); Yiqun Wu, Boulogne Billancourt (FR); Jing Liang, Shanghai (CN); Huangping Jin, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 54 days.

(21) Appl. No.: 18/749,904

(22) Filed: Jun. 21, 2024

(65) Prior Publication Data

US 2024/0348478 A1 Oct. 17, 2024

Related U.S. Application Data

(63) Continuation of application No. PCT/CN2022/140903, filed on Dec. 22, 2022.

(30) Foreign Application Priority Data

Dec. 23, 2021 (CN) ......................... 202111590532.1

(51) Int. Cl.
*H04L 25/02* (2006.01)
*H03M 7/30* (2006.01)

(52) U.S. Cl.
CPC .......... *H04L 25/0202* (2013.01); *H03M 7/70* (2013.01)

(58) Field of Classification Search
CPC ... H04L 25/0202; H04L 1/20; H04L 25/0228; H04L 25/0254; H04L 1/0026;
(Continued)

(56) References Cited

U.S. PATENT DOCUMENTS

2021/0273707 A1 9/2021 Yoo et al.
2022/0149904 A1* 5/2022 Timo .................... H04L 1/0026

FOREIGN PATENT DOCUMENTS

WO 2021102954 A1 6/2021

OTHER PUBLICATIONS

3rd Generation Partnership Project; Technical Specification Group Radio Access Network; NR; Physical layer procedures for data (Release 16). 3GPP TS 38.214 V16.7.0 (Sep. 2021), total 172 pages.
(Continued)

*Primary Examiner* — Jean B Corrielus

(57) ABSTRACT

This disclosure relates to a communication method and apparatus. A terminal device obtains M channel estimation results corresponding to M time units, where M is greater than 1. The terminal device performs joint compression on the M channel estimation results by using an encoder network, to obtain N pieces of compression information. The terminal device sends the N pieces of compression information to an access network device. Because the terminal device performs joint compression, correlation between downlink channels at different time points is fully utilized. The access network device recovers the N pieces of compression information obtained through joint compression, so that more accurate and effective downlink channel information can be obtained.

18 Claims, 10 Drawing Sheets

(58) Field of Classification Search
CPC ............... H04L 1/0029; H04L 25/0204; H04L 25/0242; H03M 7/70; G06N 3/045; G06N 3/0455; H04B 7/0626; H04B 7/0417; H04B 7/0456; H04B 7/0658; H04W 24/10; H04W 72/0446
See application file for complete search history.

(56) References Cited

OTHER PUBLICATIONS

3rd Generation Partnership Project; Technical Specification Group Radio Access Network; NR; Radio Resource Control (RRC) protocol specification (Release 16). 3GPP TS 38.331 V16.7.0 (Dec. 2021), total 967 pages.
PCT International Search Report for Application No. PCT/CN2022/140903 dated Dec. 23, 2021, 72 pages.
Zhenyu Liu et al:"A Markovian Model-Driven Deep Learning Framework for Massive MIMO CSI Feedback." Aug. 1, 2021. XP055957388, total 14 pages.
3GPP TSG RAN Rel-18 Workshop RWS-210038: "ML/AI for Wireless", Futurewei, Jun. 7, 2021, total 15 pages.
3GPP TSG RAN #91e RP-210614:"Support of Artificial Intelligence App lications for 5G Advanced", ZTE, Sanechips, Mar. 15, 2021, total 18 pages.

* cited by examiner

UE

Base station

S21: Signaling (configure channel measurement)

S22: Reference signal

S23: CSI

S24: Data (sent based on the CSI)

COMMUNICATION METHOD AND APPARATUS

CROSS-REFERENCE TO RELATED APPLICATIONS

This application is a continuation of International Application No. PCT/CN2022/140903, filed on Dec. 22, 2022, which claims priority to Chinese Patent Application No. 202111590532.1, filed on Dec. 23, 2021. The disclosures of the aforementioned applications are hereby incorporated by reference in their entireties.

TECHNICAL FIELD

This application relates to the field of communication technologies, and in particular, to a communication method and apparatus.

BACKGROUND

A 5th generation (5th generation, 5G) mobile communication system has higher requirements on a system capacity, spectral efficiency, and the like. In the 5G communication system, application of a massive multiple-input multiple-output (massive multiple-input multiple-output, massive-MIMO) technology plays an important role in improving the spectral efficiency of the system. By using the massive-MIMO technology, a base station can provide high-quality services for more user equipment (user equipment, UE). A key step is that the base station performs precoding on downlink data. Through the precoding, spatial multiplexing (spatial multiplexing) may be implemented, interference between different data streams may be reduced, and a signal to interference plus noise ratio (signal to interference plus noise ratio, SINR) at a receiving end is increased. This helps increase a system throughput rate. To more accurately perform precoding on the downlink data of the UE, the base station may obtain channel state information (channel state information, CSI) of a downlink channel, recover the downlink channel information based on the CSI, and determine a precoding matrix by using the recovered downlink channel information, to perform precoding. How to enable a base station to recover more accurate downlink channel information is a technical problem worth studying.

SUMMARY

This disclosure provides a communication method and apparatus, to reduce overheads of reporting high-precision channel state information by a terminal device.

According to a first aspect, a first communication method is provided. The method may be performed on a terminal device side. The method may be performed by using software, hardware, or a combination of software and hardware. For example, the method is performed by a terminal device, or is performed by a circuit system, or is performed by a large device including a terminal device. The circuit system can implement a function of the terminal device. The method includes: obtaining M channel estimation results, where the M channel estimation results correspond to M time units, and M is an integer greater than 1; performing joint compression on the M channel estimation results, to obtain N pieces of compression information, where N is a positive integer; and sending the N pieces of compression information to an access network device.

In this disclosure, the terminal device may perform channel estimation on downlink channels in the M time units, perform joint compression on the obtained M channel estimation results, and report the obtained M channel estimation results to the access network device. Because joint compression is performed, correlation between downlink channels at different time points is fully utilized, and the access network device recovers the N pieces of compression information obtained through joint compression, so that a more accurate and effective downlink channel information can be obtained. In addition, because joint compression is performed, the N pieces of compression information may complement each other. For example, different pieces of compression information may correspond to different parameters, to reduce redundant information and correspondingly reduce transmission overheads.

In an optional implementation, the performing joint compression on the M channel estimation results, to obtain N pieces of compression information may include: performing joint compression on the M channel estimation results by using an encoder network, to obtain the N pieces of compression information. The terminal device may process the channel estimation results by using the encoder network, so that the access network device may recover the compression information based on a corresponding decoder network. In comparison with a conventional solution, feedback of a same size may include more channel information by using a neural network, to reduce an information loss of feedback in compression and improve downlink channel recovery precision on the access network device side. Alternatively, in comparison with a conventional solution, same channel information may be represented with a smaller amount of feedback, to further reduce feedback overheads.

In an optional implementation, the plurality of channel estimation results include a first channel estimation result, and the first channel estimation result is one of the following: a channel estimation result obtained by performing measurement based on a received downlink reference signal; a processing result obtained by processing a channel estimation result obtained by performing measurement based on a received downlink reference signal; or a channel estimation result obtained through prediction. Some time units in the M time units may be past time units or current time units. For the time units, the terminal device may perform measurement based on the received downlink reference signal, to directly obtain the channel estimation results. However, some time units in the M time units may not arrive. If the terminal device obtains the channel estimation results by performing measurement after the time units arrive, a previously obtained channel estimation result may be invalid due to excessively long waiting time. Alternatively, in the M time units, the terminal device measures only downlink reference signals in some time units. Therefore, the terminal device may process the obtained channel estimation results, to obtain a channel estimation result of a future time unit or an unmeasured time unit, or the terminal device may obtain a channel estimation result of a future time unit or an unmeasured time unit through prediction. In this way, the terminal device may obtain channel estimation results of more time units in a timely manner, to reduce waiting time and improve channel information feedback efficiency. In addition, regardless of whether the channel estimation result of the future time unit is obtained based on an existing channel estimation result or the channel estimation result of the future time unit is obtained through prediction, the existing channel estimation result may be used as a reference. However, because the downlink channels are correlated in time domain, a future channel estimation result of a downlink channel that is obtained based on a previous channel estimation result of the downlink channel is more accurate. This helps the access network device recover an accurate downlink channel.

In an optional implementation, each of the N pieces of compression information corresponds to the M channel estimation results. Because joint compression is performed on the M channel estimation results, each piece of compression information can reflect the M channel estimation results, so that a more accurate downlink channel can be recovered based on the N pieces of compression information.

In an optional implementation, the performing joint compression on the M channel estimation results by using an encoder network, to obtain N pieces of compression information includes: performing joint compression on the M channel estimation results and historical information by using the encoder network, to obtain the N pieces of compression information, where the historical information includes a channel estimation result corresponding to a time unit before the M time units. The downlink channels are correlated in time domain. Therefore, in addition to the M channel estimation results, the channel estimation result corresponding to the time unit before the M time units may be further considered, so that channel estimation results participating in compression correspond to more time units. In this way, channel information represented by the compression information obtained by the access network device is more diversified, and the access network device recovers a more accurate downlink channel based on the channel estimation results in more time units.

In an optional implementation, each of the N pieces of compression information corresponds to the M channel estimation results and the historical information. Because joint compression is performed on the M channel estimation results and the historical information, each piece of compression information can reflect the M channel estimation results and the historical information, so that a more accurate downlink channel can be recovered based on the N pieces of compression information.

In an optional implementation, the method further includes: receiving configuration information from the access network device, where the configuration information is used to configure the M time units. The M time units may be configured by the access network device, so that the access network device may configure, based on a requirement, a channel estimation result in a required time unit fed back by the terminal device, to facilitate a recovery operation of the access network device. Alternatively, the M time units may be determined by the terminal device, and do not need to be configured by the access network device. In this way, signaling overheads may be reduced.

In an optional implementation, the configuration information includes one or more of the following: a start time-domain location of the M time units; an end time-domain location of the M time units; duration of the M time units; numbers of the M time units; a time-domain location of a first sampling point in M slots; a sampling period in the M time units; a quantity of sampling points in the M time units; or time-domain locations of sampling points in the M time units. In addition, the configuration information may further include other information of the M time units. The terminal device may determine the time-domain locations of the sampling points in the M time units based on the configuration information, so that channel estimation can be performed on a downlink channel at a sampling point.

In an optional implementation, the method further includes: receiving first indication information from the access network device, where the first indication information indicates parameter information of a reference encoder network or an index of a reference encoder network; or sending second indication information to the access network device, where the second indication information indicates parameter information of a reference encoder network or an index of a reference encoder network. The reference encoder network is used to determine the encoder network. The reference encoder network may be indicated by the access network device to the terminal device, and the terminal device does not need to select the reference encoder network. The access network device may select the reference encoder network based on an overall requirement, so that the selected reference encoder network is more appropriate. Alternatively, the reference encoder network may alternatively be selected by the terminal device, and does not need to be selected by the access network device, so that workload of the access network device can be reduced.

According to a second aspect, a second communication method is provided. The method may be performed on an access network device side. The method may be performed by using software, hardware, or a combination of software and hardware. For example, the method is performed by an access network device, a large device including an access network device, or a circuit system. The circuit system can implement a function of the access network device. Alternatively, the method is performed by an AI module independent of the access network device with assistance of the access network device or a network element of the access network device. This is not limited. For example, the access network device is an access network device, for example, a base station. The method includes: receiving N pieces of compression information from a terminal device, where N is a positive integer; and recovering the N pieces of compression information, to obtain K pieces of recovery information, where the K pieces of recovery information are downlink channel information in M time units, K is a positive integer, and M is an integer greater than 1.

In an optional implementation, the recovering the N pieces of compression information, to obtain K pieces of recovery information includes: recovering the N pieces of compression information by using a decoder network, to obtain the K pieces of recovered information.

In an optional implementation, each of the K pieces of recovery information corresponds to the N pieces of compression information.

In an optional implementation, the method further includes: sending configuration information to the terminal device, where the configuration information is used to configure the M time units.

In an optional implementation, the configuration information includes one or more of the following: a start time-domain location of the M time units; an end time-domain location of the M time units; duration of the M time units; numbers of the M time units; a time-domain location of a first sampling point in M slots; a sampling period in the M time units; a quantity of sampling points in the M time units; or time-domain locations of sampling points in the M time units.

In an optional implementation, a quantity of sampling points corresponding to the K pieces of recovery information is the same as or different from a quantity of sampling points corresponding to the N pieces of compression information; and/or time-domain locations of sampling points corresponding to the K pieces of recovery information are the same as or different from time-domain locations of sampling points corresponding to the N pieces of compression information. In other words, the time-domain locations of the sampling points corresponding to the K pieces of recovery information are located in the M slots, and the quantity of the sampling points corresponding to the K pieces of recovery information, the time-domain locations in the M slots, and the like are not limited. In this way, for the access network device, a recovery process may be flexible.

In an optional implementation, the method further includes: sending first indication information to the terminal device, where the first indication information indicates parameter information of a reference encoder network or an index of a reference encoder network; or receiving second indication information from the terminal device, where the second indication information indicates parameter information of a reference encoder network selected by the terminal device or an index of a reference encoder network selected by the terminal device. The reference encoder network and a reference decoder network belong to a same reference network, and the reference decoder network is used to determine the decoder network.

According to a third aspect, a communication apparatus is provided. The communication apparatus may implement the method according to the first aspect. The communication apparatus has a function of the terminal device. In an optional implementation, the apparatus may include a one-to-one corresponding module for performing the method/operation/step/action described in the first aspect. The module may be a hardware circuit, or may be software, or may be implemented by a hardware circuit in combination with software. In an optional implementation, the communication apparatus includes a baseband apparatus and a radio frequency apparatus. In another optional implementation, the communication apparatus includes a processing unit (also referred to as a processing module sometimes) and a transceiver unit (also referred to as a transceiver module sometimes). The transceiver unit can implement a sending function and a receiving function. When the transceiver unit implements the sending function, the transceiver unit may be referred to as a sending unit (also referred to as a sending module sometimes). When the transceiver unit implements the receiving function, the transceiver unit may be referred to as a receiving unit (also referred to as a receiving module sometimes). The sending unit and the receiving unit may be a same functional module, and the functional module is referred to as the transceiver unit. The functional module can implement the sending function and the receiving function. Alternatively, the sending unit and the receiving unit may be different functional modules, and the transceiver unit is a general term for the functional modules.

The processing unit is configured to: obtain M channel estimation results, and performs joint compression on the M channel estimation results, to obtain N pieces of compression information, where the M channel estimation results correspond to M time units, M is an integer greater than 1, and N is a positive integer. The transceiver unit is configured to send the N pieces of compression information to an access network device.

For another example, the communication apparatus includes a processor, coupled to a memory, and configured to execute instructions in the memory, to implement the method according to the first aspect. Optionally, the communication apparatus further includes other components, for example, an antenna, an input/output module, an interface, and the like. The components may be hardware, software, or a combination of software and hardware.

According to a fourth aspect, a communication apparatus is provided. The communication apparatus may implement the method according to the second aspect. The communication apparatus has a function of the access network device. The access network device is, for example, a base station, or a baseband apparatus in a base station. In an optional implementation, the apparatus may include a one-to-one corresponding module for performing the method/operation/step/action described in the second aspect. The module may be a hardware circuit, or may be software, or may be implemented by a hardware circuit in combination with software. In an optional implementation, the communication apparatus includes a baseband apparatus and a radio frequency apparatus. In another optional implementation, the communication apparatus includes a processing unit (also referred to as a processing module sometimes) and a transceiver unit (also referred to as a transceiver module sometimes). For an implementation of the transceiver unit, refer to the related descriptions in the third aspect.

The transceiver unit is configured to receive N pieces of compression information from a terminal device, where N is a positive integer. The processing unit is configured to recover the N pieces of compression information, to obtain K pieces of recovery information, where each of the K pieces of recovery information is downlink channel information in M time units, K is a positive integer, and M is an integer greater than 1.

For another example, the communication apparatus includes a processor, coupled to a memory, and configured to execute instructions in the memory, to implement the method according to the second aspect. Optionally, the communication apparatus further includes other components, for example, an antenna, an input/output module, an interface, and the like. The components may be hardware, software, or a combination of software and hardware.

According to a fifth aspect, a computer-readable storage medium is provided. The computer-readable storage medium is configured to store a computer program or instructions, and when the computer program or instructions is/are run, the method according to the first aspect and/or the method in the second aspect is implemented.

According to a sixth aspect, a computer program product including instructions is provided. When the computer program product is run on a computer, the method according to the first aspect and/or the second aspect is implemented.

According to a seventh aspect, a chip system is provided. The chip system includes a processor, and may further include a memory, and the chip system is configured to implement the method according to the first aspect and/or the second aspect. The chip system may include a chip, or may include a chip and another discrete component.

According to an eighth aspect, a communication system is provided, including the communication apparatus according to the third aspect and the communication apparatus according to the fourth aspect.

DESCRIPTION OF EMBODIMENTS

To make objectives, technical solutions, and advantages of this disclosure clearer, the following describes this disclosure in detail with reference to accompanying drawings.

Figures 1, 2:
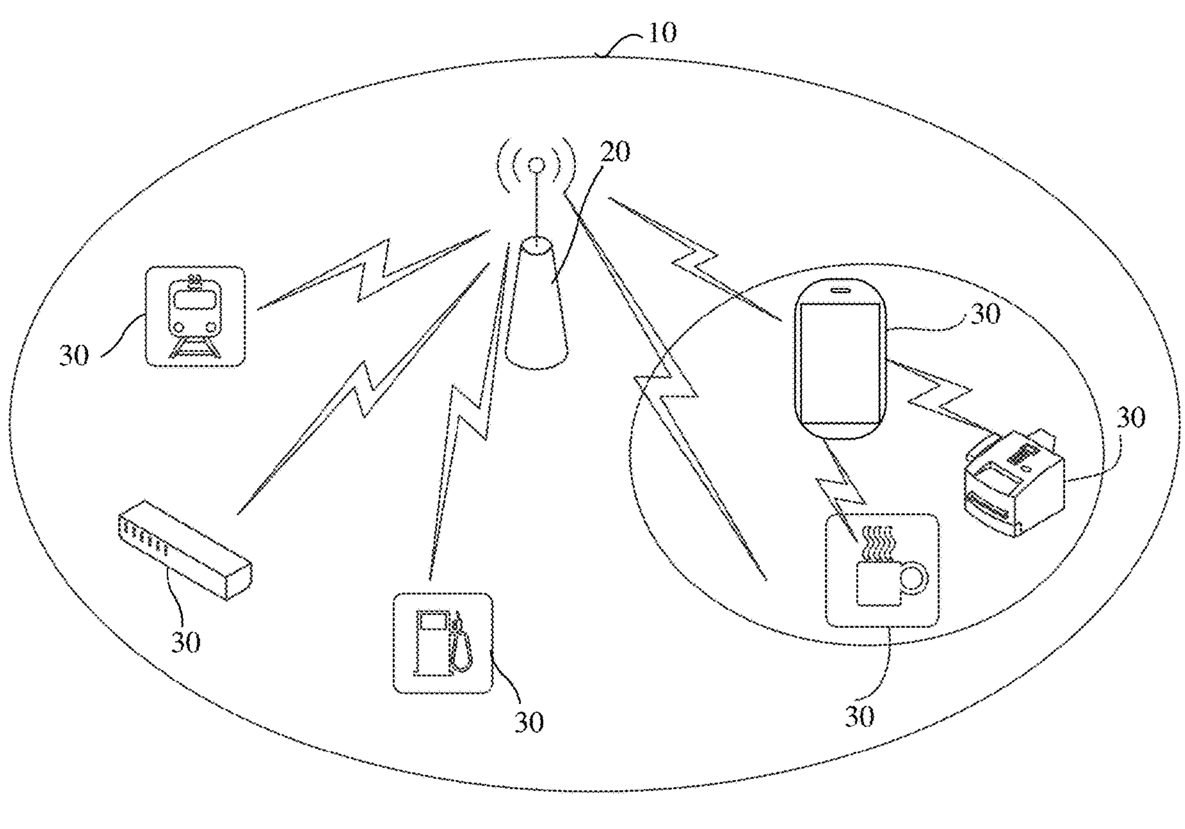
FIG. 1 is a diagram of a communication system.
FIG. 2 is a flowchart of a CSI feedback mechanism.

The technology provided in this disclosure may be applied to a communication system 10 shown in FIG. 1. The communication system 10 includes one or more communication apparatuses 30 (for example, a terminal device). The one or more communication apparatuses 30 are connected to one or more core network (core network, CN) devices by using one or more access network (radio access network, RAN) devices 20, to implement communication between a plurality of communication devices. For example, the communication system 10 is a communication system that supports a 4th generation (the 4th generation, 4G) (including long-term evolution (long-term evolution, LTE)) access technology, a communication system that supports a 5G (sometimes also referred to as new radio, NR) access technology, a wireless fidelity (wireless fidelity, Wi-Fi) system, a cellular system related to the 3rd generation partnership project (3rd generation partnership project, 3GPP), a communication system that supports convergence of a plurality of radio technologies, a future-oriented evolution system, and the like. This is not limited.

The following separately describes in detail the terminal device and the RAN in FIG. 1.

1. Terminal Device

The terminal device may be briefly referred to as a terminal. The terminal device may be a device having a wireless transceiver function. The terminal device may be mobile or fixed. The terminal device may be deployed on land, where the deployment includes indoor, outdoor, hand-held or vehicle-mounted deployment, may be deployed on water (for example, on a ship), or may be deployed in the air (for example, on an airplane, a balloon, or a satellite). The terminal device may include a mobile phone (mobile phone), a tablet computer (pad), a computer with a wireless transceiver function, a virtual reality (virtual reality, VR) terminal device, an augmented reality (augmented reality, AR) terminal device, a wireless terminal device in industrial control (industrial control), a wireless terminal device in self-driving (self-driving), a wireless terminal device in a remote medical surgery (remote medical surgery), a wireless terminal device in a smart grid (smart grid), a wireless terminal device in transportation safety (transportation safety), a wireless terminal device in a smart city (smart city), and/or a wireless terminal device in a smart home (smart home). Alternatively, the terminal device may be a cellular phone, a cordless phone, a session initiation protocol (session initiation protocol, SIP) phone, a wireless local loop (wireless local loop, WLL) station, a personal digital assistant (personal digital assistant, PDA), a hand-held device or a computing device with a wireless communication function, a vehicle-mounted device, a wearable device, a terminal device in a future 5th generation (5th generation, 5G) network, a terminal device in a further evolved public land mobile network (public land mobile network, PLMN), or the like. The terminal device may also be referred to as user equipment (user equipment, UE). Optionally, the terminal device may communicate with a plurality of access network devices that use different technologies. For example, the terminal device may communicate with an access network device that supports LTE, or may communicate with an access network device that supports 5G, or may implement dual connectivity to an access network device that supports LTE and an access network device that supports 5G. This is not limited in this disclosure.

In this disclosure, an apparatus configured to implement a function of a terminal device may be a terminal device, or may be an apparatus that can support a terminal device in implementing the function, for example, a chip system, a hardware circuit, a software module, or a hardware circuit combined with a software module. The apparatus may be installed in the terminal device or may be matched with the terminal device for usage. In the technical solutions provided in this disclosure, an example in which the apparatus configured to implement the function of the terminal device is a terminal device and the terminal device is UE is used to describe the technical solutions provided in this disclosure.

In this disclosure, the chip system may include a chip, or may include a chip and another discrete component.

2. RAN

The RAN may include one or more RAN devices, for example, a RAN device 20. An interface between the RAN device and the terminal device may be a Uu interface (or referred to as an air interface). In future communication, names of interfaces may remain unchanged, or may be replaced with other names. This is not limited in this application.

The RAN device is a node or a device that enables the terminal device to access a radio network, and the RAN device may also be referred to as a network device or a base station. The RAN device includes, for example, but is not limited to: a base station, a next generation NodeB (next generation NodeB, gNB) in 5G, an evolved NodeB (evolved NodeB, eNB), a radio network controller (radio network controller, RNC), a NodeB (NodeB, NB), a base station controller (base station controller, BSC), a base transceiver station (base transceiver station, BTS), a home base station (for example, a home evolved NodeB, or a home NodeB, HNB), a baseband unit (baseband unit, BBU), a transmission reception point (transmission reception point, TRP), a transmission point (transmission point, TP), and/or a mobile switching center. Alternatively, the access network device may be at least one of a central unit (central unit, CU), a distributed unit (distributed unit, DU), a central unit control plane (CU control plane, CU-CP) node, a central unit user plane (CU user plane, CU-UP) node, an integrated access and backhaul (integrated access and backhaul, IAB) node, a radio controller in a cloud radio access network (cloud radio access network, CRAN), or the like. Alternatively, the access network device may be a relay station, an access point, a vehicle-mounted device, a terminal device, a wearable device, an access network device in a 5G network, an access network device in a future evolved public land mobile network (public land mobile network, PLMN), or the like.

In this disclosure, an apparatus configured to implement a function of an access network device may be an access network device, or may be an apparatus that can support an access network device in implementing the function, for example, a chip system, a hardware circuit, a software module, or a hardware circuit combined with a software module. The apparatus may be installed in the access network device or may be matched with the access network device for usage. In the technical solutions provided in this disclosure, an example in which the apparatus configured to implement the function of the access network device is an access network device and the access network device is a base station is used to describe the technical solutions provided in this disclosure.

(1) Protocol Layer Structure

Communication between an access network device and a terminal device complies with a specific protocol layer structure. The protocol layer structure may include a control plane protocol layer structure and a user plane protocol layer structure. For example, the control plane protocol layer structure may include at least one of the following: a radio resource control (radio resource control, RRC) layer, a packet data convergence protocol (packet data convergence protocol, PDCP) layer, a radio link control (radio link control, RLC) layer, a media access control (media access control, MAC) layer, a physical layer (physical, PHY), and the like. For example, the user plane protocol layer structure may include at least one of the following: a service data adaptation protocol (service data adaptation protocol, SDAP) layer, a PDCP layer, an RLC layer, a MAC layer, a physical layer, and the like.

The protocol layer structure between the access network device and the terminal device may be considered as an access stratum (access stratum, AS) structure. Optionally, a non-access stratum (non-access stratum, NAS) may further exist on the AS, and is used by the access network device to forward information from a core network device to the terminal device, or is used by the access network device to forward information from the terminal device to a core network device. In this case, it may be considered that there is a logical interface between the terminal device and the core network device. Optionally, the access network device may forward the information between the terminal device and the core network device through transparent transmission. For example, a NAS message may be mapped to or included in RRC signaling as an element of the RRC signaling.

Optionally, the protocol layer structure between the access network device and the terminal device may further include an artificial intelligence (artificial intelligence, AI) layer for transmitting data related to an AI function.

(2) Central Unit (Central Unit, CU) and Distributed Unit (Distributed Unit, DU)

An RAN device may include a CU and a DU. This design may be referred to as a CU and DU separation design. A plurality of DUs may be controlled by one CU in a centralized manner. For example, an interface between the CU and the DU may be referred to as an F1 interface. A control plane (control plane, CP) interface may be F1-C, and a user plane (user plane, UP) interface may be F1-U. Specific names of the interfaces are not limited in this disclosure. The CU and the DU may be divided based on a protocol layer of a radio network. For example, functions of a PDCP layer and a protocol layer above the PDCP layer (for example, an RRC layer and an SDAP layer) are set on the CU, and functions of a protocol layer below the PDCP layer (for example, an RLC layer, a MAC layer, and a PHY layer) are set on the DU. For another example, functions of a protocol layer above a PDCP layer are set on the CU, and functions of the PDCP layer and a protocol layer below the PDCP layer are set on the DU.

The division into the processing functions of the CU and the DU based on protocol layers is merely an example, and may also be divided in another manner. For example, the CU or the DU may be divided to have functions having more protocol layers. For another example, the CU or the DU may be further divided to have some processing functions having protocol layers. In a design, some functions of the RLC layer and functions of a protocol layer above the RLC layer are set on the CU, and remaining functions of the RLC layer and functions of a protocol layer below the RLC layer are set on the DU. In another design, division into functions of the CU or the DU may alternatively be performed based on service types or other system requirements. For example, division may be performed based on latencies. Functions whose processing time needs to satisfy a latency requirement are set on the DU, and functions whose processing time does not need to satisfy the latency requirement are set on the CU.

Optionally, the CU may also have one or more functions of a core network. For example, the CU may be disposed on a network side to facilitate centralized management.

Optionally, a radio unit (radio unit, RU) of the DU is disposed remotely. The RU has a radio frequency function. For example, the DU and the RU may be divided at a PHY layer. For example, the DU may implement higher-layer functions of the PHY layer, and the RU may implement lower-layer functions of the PHY layer. When transmission is performed, functions of the PHY layer may include at least one of the following: adding cyclic redundancy check (cyclic redundancy check, CRC), channel coding, rate matching, scrambling, modulation, layer mapping, precoding, resource mapping, physical antenna mapping, or radio frequency sending. When reception is performed, functions of the PHY layer may include at least one of the following: CRC check, channel decoding, de-rate matching, descrambling, demodulation, layer de-mapping, channel detection, resource de-mapping, physical antenna de-mapping, or radio-frequency receiving. The higher-layer functions of the PHY layer may include a part of functions of the PHY layer. For example, the part of functions are closer to the MAC layer. The lower-layer functions of the PHY layer may include another part of functions of the PHY layer. For example, the part of functions are closer to the radio-frequency receiving function. For example, the higher-layer functions of the PHY layer may include adding CRC check, channel coding, rate matching, scrambling, modulation, and layer mapping, and the lower-layer functions of the PHY layer may include precoding, resource mapping, physical antenna mapping, and radio frequency sending functions. Alternatively, the higher-layer functions of the PHY layer may include CRC check, channel coding, rate matching, scrambling, modulation, layer mapping, and precoding, and the lower-layer functions of the PHY layer may include resource mapping, physical antenna mapping, and radio frequency sending functions. For example, the higher-layer functions of the PHY layer may include adding CRC check, channel decoding, de-rate matching, decoding, demodulation, and layer de-mapping, and the lower-layer functions of the PHY layer may include channel detection, resource de-mapping, physical antenna de-mapping, and radio-frequency receiving. Alternatively, the higher-layer functions of the PHY layer may include CRC check, channel decoding, de-rate matching, decoding, demodulation, layer de-mapping, and channel detection, and the lower-layer functions of the PHY layer may include resource de-mapping, physical antenna de-mapping, and radio-frequency receiving.

Optionally, the functions of the CU may be further divided, and a control plane and a user plane are separated and implemented by using different entities, namely, a control plane CU entity (that is, a CU-CP entity) and a user plane CU entity (that is, a CU-UP entity), respectively. The CU-CP entity and the CU-UP entity may be separately coupled to or connected to the DU, to jointly complete a function of the RAN device.

In the foregoing network architecture, signaling generated by the CU may be sent to a terminal device by using the DU, or signaling generated by a terminal device may be sent to the CU by using the DU. For example, signaling at the RRC or PDCP layer may be finally processed as signaling at the physical layer and sent to the terminal device, or is converted from signaling received from the physical layer. In the architecture, the signaling at the RRC layer or PDCP layer may be considered to be sent by using the DU, or sent by using the DU and the RU.

Optionally, any one of the DU, the CU, the CU-CP, the CU-UP, and the RU may be a software module, a hardware structure, or a combination of a software module and a hardware structure. This is not limited. Different entities may exist in different forms. This is not limited. For example, the DU, the CU, the CU-CP, and the CU-UP are software modules, and the RU is a hardware structure. The modules and methods performed by the modules also fall within the protection scope of this disclosure. For example, when the method in this disclosure is performed by an access network device, the method may be specifically performed by at least one of a CU, a CU-CP, a CU-UP, a DU, an RU, or a near-real-time RIC described below. The methods performed by the modules also fall within the protection scope of this disclosure.

It should be noted that, because a network device in this disclosure is mainly an access network device, in the following, unless otherwise specified, the "network device" may be an "access network device".

It should be understood that a quantity of devices in the communication system shown in FIG. 1 is merely used as an example, and this disclosure is not limited thereto. In actual application, the communication system may further include more terminal devices and more RAN devices, and may further include another device, for example, may include a core network device and/or a node configured to implement an artificial intelligence function.

The network architecture shown in FIG. 1 may be applicable to communication systems of various radio access technologies (radio access technologies, RAT), for example, a 4G communication system, a 5G (or referred to as new radio (new radio, NR)) communication system, a transition system between an LTE communication system and the 5G communication system, where the transition system may also be referred to as a 4.5G communication system, or a future communication system, for example, a 6G communication system. A network architecture and a service scenario described in this disclosure are intended to describe the technical solutions in this disclosure more clearly, and do not constitute a limitation on the technical solutions provided in this disclosure. A person of ordinary skill in the art may know that, with evolution of the network architecture and emergence of a new service scenario, the technical solutions provided in this disclosure are also applicable to similar technical problems.

In addition to communication between an access network device and a terminal device, the method provided in this application may also be used for communication between other communication devices, for example, communication between a macro base station and a micro base station in a wireless backhaul link, or communication between a first terminal device and a second terminal device in a sidelink (sidelink, SL). This is not limited. This disclosure is described by using communication between a network device and a terminal device as an example.

When sending data to the terminal device, the access network device may perform precoding based on channel state information (channel state information, CSI) fed back by the terminal device. For ease of understanding this disclosure, the following briefly describes some technical terms in this disclosure.

1. Precoding Technology

When channel state information is known, an access network device may process a to-be-sent signal by using a precoding matrix that matches a channel condition. By using the technology, the pre-coded to-be-sent signal matches a channel, so that quality (for example, a signal to interference plus noise ratio (signal to interference plus noise ratio, SINR)) of a signal received by a terminal device is improved, to further improve a system throughput rate. By using the precoding technology, a sending device (for example, an access network device) and a plurality of receiving devices (for example, terminal devices) may effectively perform transmission on a same time-frequency resource, that is, effectively implement multi-user multiple-input multiple-output (multi-user multiple-input multiple-output, MU-MIMO). By using the precoding technology, a sending device (for example, an access network device) and a receiving device (for example, a terminal device) may effectively transmit a plurality of data streams on a same time-frequency resource, that is, effectively implement single-user multiple-input multiple-output (single-user multiple-input multiple-output, SU-MIMO). It should be noted that related descriptions of the precoding technology are merely examples for ease of understanding, and are not intended to limit a disclosure scope of this disclosure. In a specific implementation process, the sending device may alternatively perform precoding in another manner. For example, when channel information (for example, but not limited to a channel matrix) cannot be obtained, precoding is performed by using a preset precoding matrix or by using weighted processing. For brevity, specific content thereof is not described in this specification again.

2. CSI Feedback (CSI Feedback)

The CSI feedback may also be referred to as a CSI report (CSI report). According to the CSI feedback, in a wireless communication system, a receiving end (for example, a terminal device) of data (for example, but not limited to data carried on a physical downlink shared channel (physical downlink shared channel, PDSCH)) reports, to a transmitting end (for example, an access network device), information for describing a channel attribute of a communication link. The CSI report includes, for example, one or more of pieces of information such as a downlink channel matrix, a precoding matrix indicator (precoding matrix indicator, PMI), a rank indicator (rank indicator, RI), a channel quality indicator (channel quality indicator, CQI), or the like. Content included in the enumerated CSI is merely an example for descriptions, and shall not constitute any limitation on this disclosure. The CSI may include one or more of the foregoing information, or may include other information used to represent the CSI in addition to the foregoing enumerated information. This is not limited in this disclosure.

3. Neural Network (Neural Network, NN)

A neural network is a specific implementation form of a machine learning technology. According to a universal approximation theorem, the neural network can theoretically approximate to any continuous function, so that the neural network can learn any mapping. In a conventional communication system, rich expertise is required to design a communication module. However, in a neural network-based deep learning communication system, an implicit pattern structure may be automatically discovered from a large quantity of data sets and a mapping relationship between data may be established, to obtain performance better than that of a conventional modeling method.

For example, a deep neural network (deep neural network, DNN) is a neural network with a large quantity of layers. Depending on different network structures and/or usage scenarios, the DNN may include a multi-layer perceptron (multi-layer perceptron, MLP), a convolutional neural network (convolutional neural network, CNN), a recursive neural network (recurrent neural network, RNN), and the like. A specific form of the DNN is not limited in this disclosure.

4. Auto-Encoder (Auto-Encoder, AE) Network, or AE for Short.

The AE network may include an encoder (encoder) and a corresponding decoder (decoder). For example, the encoder and/or the decoder are/is implemented by using a neural network (for example, a DNN). In this case, the encoder may also be referred to as an encoder network, and the decoder may also be referred to as a decoder network. For example, in the AE network, the encoder and the corresponding decoder may be obtained through joint training. The encoder and the decoder that are obtained through training may be configured to encode and decode information.

In this disclosure, unless otherwise specified, a quantity of nouns represents "a singular noun or plural nouns", that is, "one or more". "At least one" means one or more, and "a plurality of" means two or more. "And/or" describes an association relationship between associated objects and indicates that three relationships may exist. For example, A and/or B may indicate the following three cases: Only A exists, both A and B exist, and only B exists, where A and B may be singular or plural. When representing a feature, the character "/" may indicate an "or" relationship between associated objects. For example, A/B indicates A or B. When representing an operation, the symbol "/" may further represent a division operation. In addition, in this disclosure, the symbol "x" may also be replaced with a symbol "*".

The ordinal numbers such as "first" and "second" in this disclosure are used to distinguish a plurality of objects, and are not used to limit sizes, content, sequences, time sequences, application scenarios, priorities, importance, or the like of the plurality of objects. For example, first indication information and second indication information may be same indication information, or may be different indication information. In addition, this type of name does not indicate that sizes, transmission modes, indicated content, priorities, application scenarios, importance, or the like of the two pieces of indication information are different.

In a possible implementation, the CSI feedback mechanism uses a procedure shown in FIG. 2.

S21: A base station sends signaling, and correspondingly UE receives the signaling from the base station.

The signaling is used to configure channel measurement information. For example, the signaling notifies the UE of at least one of the following: time information for performing channel measurement, a type of a reference signal (reference signal, RS) for performing channel measurement, a time-domain resource of a reference signal, a frequency-domain resource of a reference signal, a reporting condition of a measurement quantity, or the like.

S22: The base station sends a reference signal to the UE, and correspondingly the UE receives the reference signal from the base station.

The UE measures the reference signal to obtain CSI.

S23: The UE sends the CSI to the base station, and correspondingly the base station receives the CSI from the UE.

S24: The base station sends data to the UE based on the CSI, and correspondingly the UE receives the data from the base station.

The data sent by the base station to the UE is carried on a downlink channel, for example, carried on a PDSCH.

The CSI can represent information about a downlink channel matrix. After the UE feeds back the CSI to the base station, the base station may recover downlink channel information based on the CSI, to determine information such as a precoding matrix based on the downlink channel information. Higher accuracy of the CSI fed back by the UE indicates more information about the downlink channel matrix and more accurate downlink channel information that can be recovered by the base station based on the CSI. Therefore, a more accurate precoding matrix determined by the base station indicates better downlink spatial multiplexing performance, a higher received signal to interference plus noise ratio of the UE, and a higher system throughput rate. Alternatively, after the UE feeds back the CSI to the base station, the base station may not need to recover the downlink channel information, but determine information such as a precoding matrix based on the CSI. In this case, higher CSI precision indicates a more accurate precoding matrix determined by the base station. However, as a scale of an antenna array in a MIMO system continuously increases, a quantity of antenna ports that can be supported also increases. Because a size of a complete downlink channel matrix is in direct proportion to the quantity of antenna ports, in a massive MIMO system, enormous feedback overheads are required to ensure high precision of CSI fed back by UE. Because of the enormous feedback overheads, available resources for data transmission are reduced, and therefore a system capacity is reduced. Therefore, to increase the system capacity, how to reduce the CSI feedback overheads needs to be studied.

Deep learning (deep learning, DL) is machine learning based on a deep neural network. The CSI is fed back through deep learning. In comparison with a conventional solution, in this method, approximately same downlink channel information may be represented with a smaller amount of feedback, so that CSI feedback overheads can be reduced, or channel recovery precision can be improved by using same overheads. In a deep learning-based CSI compression feedback technology, channel compression feedback is performed by using an AE model based on a convolutional neural network (convolutional neural network, CNN). The AE model includes an encoder (encoder) model and a decoder (decoder) model that match with each other for use. Specifically, at the UE (that is, an information transmitting end), the encoder model in the AE maps a downlink channel matrix in a slot to compression information, where the encoder model is a CNN-type neural network; and at the base station (that is, an information receiving end), the decoder model of the AE may recover the compression information to downlink channel information, where the decoder model is a CNN-type neural network. In this manner, the UE may need to separately feed back CSI of a plurality of slots to the base station. This still causes large overheads.

In view of this, the technical solutions of this disclosure are provided. In this disclosure, the UE may perform channel estimation on downlink channels in M time units, perform joint compression on obtained M channel estimation results, and report the obtained M channel estimation results to the access network device. Because joint compression is performed, correlation between downlink channels at different time points is fully utilized, and the access network device recovers N pieces of compression information obtained through joint compression, so that a more accurate and effective downlink channel information can be obtained. In addition, because joint compression is performed, the N pieces of compression information may complement each other. For example, different pieces of compression information may correspond to different parameters, to reduce redundant information and correspondingly reduce transmission overheads.

Figure 3:
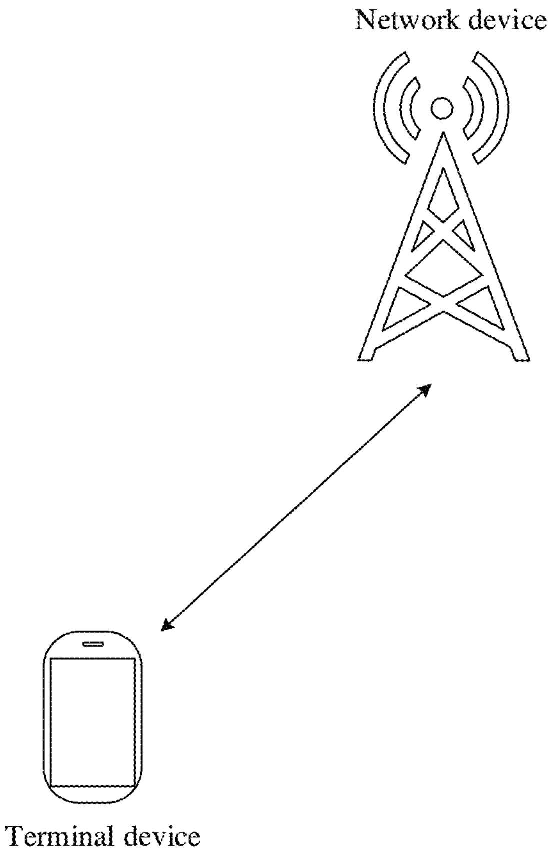
FIG. 3 is a diagram of an architecture of a communication network in a communication system.

FIG. 3 shows an architecture of a communication network in a communication system 10 according to this disclosure. Any subsequently provided embodiment is applicable to the architecture. A network device included in FIG. 3 is, for example, the access network device 20 included in the communication system 10, and a terminal device included in FIG. 3 is, for example, the communication apparatus 30 included in the communication system 10. The network device can communicate with the terminal device.

A machine learning technology in this disclosure is a specific implementation of an artificial intelligence (artificial intelligence, AI) technology. For ease of understanding, the following describes the AI technology. It may be understood that the descriptions are not intended to limit this disclosure.

AI is a technology that performs complex calculation by simulating the human brain. With improvement of data storage and capabilities, AI is applied more widely.

In this disclosure, an independent network element (for example, referred to as an AI network element, an AI node, or an AI device) may be introduced into the communication system shown in FIG. 1 to implement an AI function. The AI network element may be directly connected to the access network device, or may be indirectly connected to the access network device by using a third-party network element. Optionally, the third-party network element may be a core network element. Alternatively, an AI entity may be configured or disposed in another network element in the communication system, to implement an AI-related operation. The AI entity may also be referred to as an AI module, an AI unit, or another name, and is mainly configured to implement some or all AI functions. A specific name of the AI entity is not limited in this disclosure. Optionally, the another network element may be an access network device, a core network device, operations, administration and maintenance (operations, administration and maintenance, OAM), or the like. In this case, the network element that performs the AI function is a network element with a built-in AI function.

In this disclosure, the AI function may include at least one of the following: data collection, model training (or model learning), model information release, model inference (or referred to as model deduction, inference, prediction, or the like), model monitoring or model verification, inference result release, or the like. The AI function may also be referred to as an AI (related) operation or an AI-related function.

In this disclosure, the OAM is configured to operate, administer, and/or maintain a core network device (OAM of the core network device), and/or is configured to operate, administer, and/or maintain an access network device (OAM of the access network device). For example, this disclosure includes first OAM and second OAM, where the first OAM is OAM of a core network device, and the second OAM is OAM of an access network device. Optionally, the first OAM and/or the second OAM include/includes an AI entity. For another example, this disclosure includes third OAM, and the third OAM is OAM of both a core network device and an access network device. Optionally, the third OAM includes an AI entity.

Figure 4A:
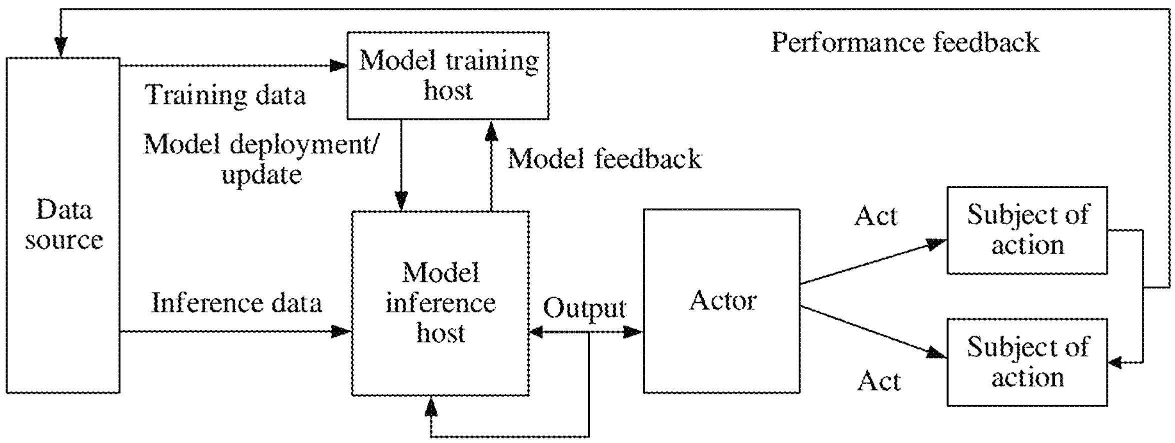
FIG. 4A to FIG. 4E are diagrams of several application frameworks of AI in a communication system.

FIG. 4A is a diagram of a first application framework of AI in a communication system. A data source (data source) is used to store training data and inference data. A model training host (model training host) performs training or update training based on training data (training data) provided by a data source to obtain an AI model, and deploys the AI model on a model inference host (model inference host). The AI model represents a mapping relationship between an input and an output of the model. Obtaining an AI model through learning by the model training host is equivalent to obtaining the mapping relationship between the input and the output of the model through learning by the model training host by using training data. The model inference host uses the AI model to perform inference based on inference data provided by the data source and obtain an inference result. The method may alternatively be described as follows: A model inference host inputs inference data to an AI model, and obtains an output by using the AI model, where the output is an inference result. The inference result may indicate a configuration parameter used (acted) by a subject of action, and/or an operation performed by the subject of action. The inference result may be uniformly planned by an actor (actor), and sent to one or more subjects of action objects (for example, a core network element, a base station, or UE) for action. Optionally, the model inference host may feed back the inference result of the model inference host to the model training host. This process may be referred to as model feedback. The inference result that is fed back is used by the model training host to update the AI model, and the updated AI model is deployed in the model inference host. Optionally, the subject of action may feed back, to the data source, a network parameter collected by the subject of action. This process may be referred to as performance feedback, and the fed-back network parameter may be used as the training data or the inference data.

For example, the AI model includes a decoder network in an AE network. The decoder network is deployed on an access network device side. An inference result of the decoder network is, for example, used for reconfiguration of a downlink channel matrix. The AI model includes an encoder network in an AE network. The encoder network is deployed on a UE side. An inference result of the encoder network is, for example, used for encoding of a downlink channel matrix.

The application framework shown in FIG. 4A may be deployed in the network element shown in FIG. 1. For example, the application framework in FIG. 4A may be deployed in at least one of the terminal device, the access network device, a core network device (not shown), or an independently deployed AI network element (not shown) in FIG. 1. For example, the AI network element (which may be considered as a model training host) may analyze or train training data (training data) provided by the terminal device and/or the access network device, to obtain a model. The at least one of the terminal device, the access network device, or the core network device (which may be considered as a model inference host) may perform inference by using the model and inference data, to obtain an output of the model.

The inference data may be provided by the terminal device and/or the access network device. An input of the model includes the inference data, and an output of the model is an inference result corresponding to the model. The at least one of the terminal device, the access network device, or the core network device (which may be considered as a subject of action) may perform a corresponding operation based on the inference result. The model inference host and the subject of action may be the same or may be different. This is not limited.

With reference to FIG. 4B to FIG. 4E, the following describes, by using an example, a network architecture to which the method provided in this disclosure can be applied.

Figure 4B:
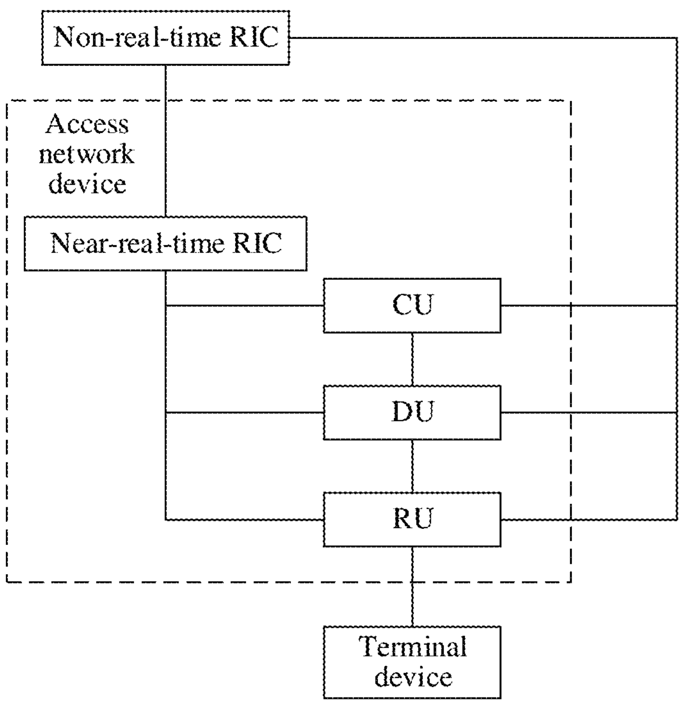

As shown in FIG. 4B, in a first possible implementation, an access network device includes a near-real-time radio access network intelligent controller (RAN intelligent controller, RIC) module for model training and inference. For example, the near-real-time RIC may be configured to train an AI model, and use the AI model for inference. For example, the near-real-time RIC may obtain information of a network side and/or a terminal side from at least one of a CU, a DU, and an RU, and the information may be used as training data or inference data. Optionally, the near-real-time RIC may submit an inference result to at least one of the CU, the DU, the RU, or a terminal device. Optionally, the CU and the DU may exchange the inference result. Optionally, the DU and the RU may exchange the inference result. For example, the near-real-time RIC submits the inference result to the DU, and the DU forwards the inference result to the RU.

As shown in FIG. 4B, in a second possible implementation, a non-real-time RIC (optionally, the non-real-time RIC may be located in OAM or a core network device) is located outside an access network, and is used for model training and inference. For example, the non-real-time RIC is configured to train an AI model and use the model for inference. For example, the non-real-time RIC may obtain information of a network side and/or a terminal side from at least one of a CU, a DU, or an RU, and the information may be used as training data or inference data. An inference result may be submitted to at least one of the CU, the DU, the RU, or a terminal device. Optionally, the CU and the DU may exchange the inference result. Optionally, the DU and the RU may exchange the inference result. For example, the non-real-time RIC submits the inference result to the DU, and the DU forwards the inference result to the RU.

As shown in FIG. 4B, in a third possible implementation, an access network device includes a near-real-time RIC, and a non-real-time RIC is located outside the access network device (optionally, the non-real-time RIC may be located in OAM or a core network device). Same as the foregoing second possible implementation, the non-real-time RIC may be used for model training and inference; and/or same as the first possible implementation, the near-real-time RIC may be used for model training and inference; and/or the non-real-time RIC performs model training, and the near-real-time RIC may obtain AI model information from the non-real-time RIC, obtain information of a network side and/or terminal side from at least one of a CU, a DU, or an RU, and obtain an inference result by using the information and the AI model information. Optionally, the near-real-time RIC may submit an inference result to at least one of the CU, the DU, the RU, or a terminal device. Optionally, the CU and the DU may exchange the inference result. Optionally, the DU and the RU may exchange the inference result. For example, the near-real-time RIC submits the inference result to the DU, and the DU forwards the inference result to the RU. For example, the near-real-time RIC is configured to train a model A, and use the model A for inference. For example, the non-real-time RIC is configured to train a model B, and use the model B for inference. For example, the non-real-time RIC is configured to train a model C and send information about the model C to the near-real-time RIC, and the near-real-time RIC uses the model C for inference.

Figure 4C:
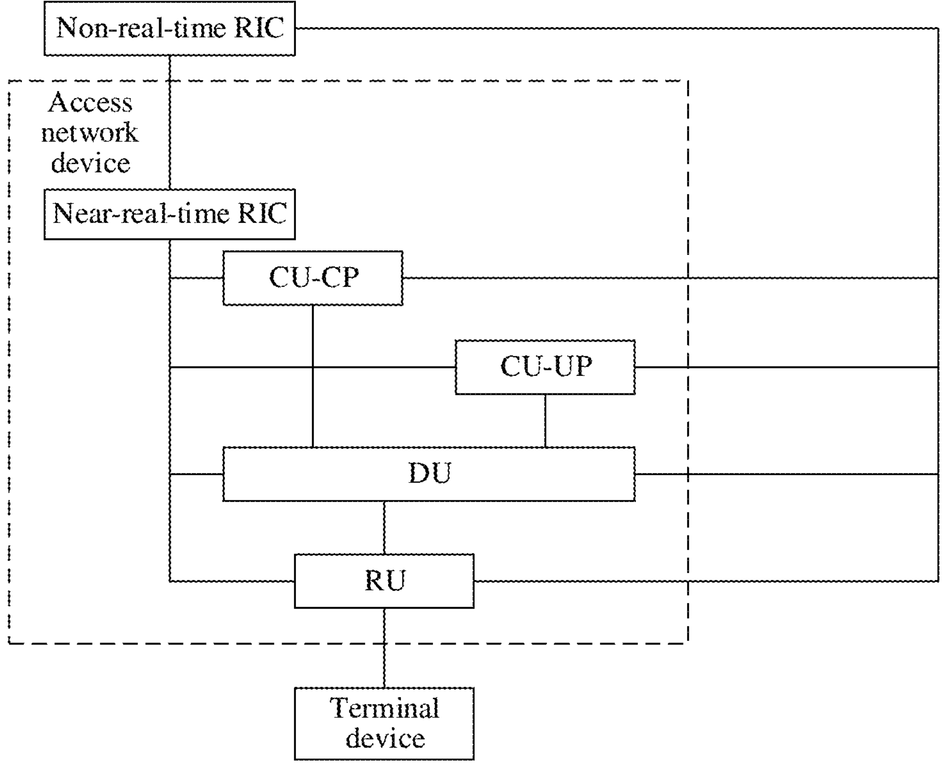

FIG. 4C is an example diagram of a network architecture to which a method according to this disclosure can be applied. Compared with FIG. 4B, a CU in FIG. 4C is separated into a CU-CP and a CU-UP.

Figure 4D:
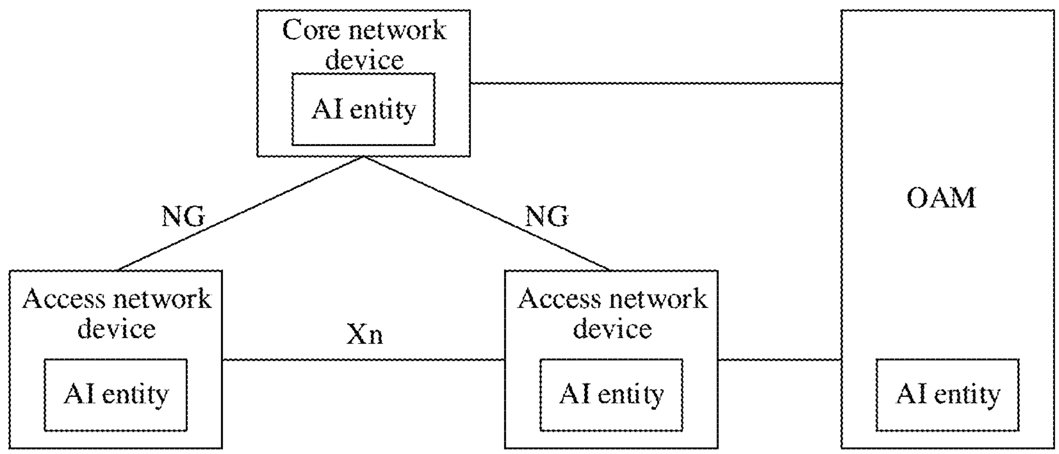

FIG. 4D is an example diagram of a network architecture to which a method according to this disclosure can be applied. As shown in FIG. 4D, optionally, an access network device includes one or more AI entities, and a function of the AI entity is similar to that of the near-real-time RIC. Optionally, OAM includes one or more AI entities, and a function of the AI entity is similar to that of the non-real-time RIC. Optionally, a core network device includes one or more AI entities, and a function of the AI entity is similar to that of the non-real-time RIC. When the OAM and the core network device each include an AI entity, models obtained by training by the AI entities of the OAM and the core network device are different, and/or models used for inference are different.

In this disclosure, the models are different in at least one of the following: a structure parameter of the model (for example, at least one of a quantity of neural network layers, a neural network width, a connection relationship between layers, a weight of a neuron, an activation function of a neuron, or an offset in an activation function), an input parameter of the model (for example, a type of the input parameter and/or dimensions of the input parameter), or an output parameter of the model (for example, a type of the output parameter and/or dimensions of the output parameter).

Figure 4E:
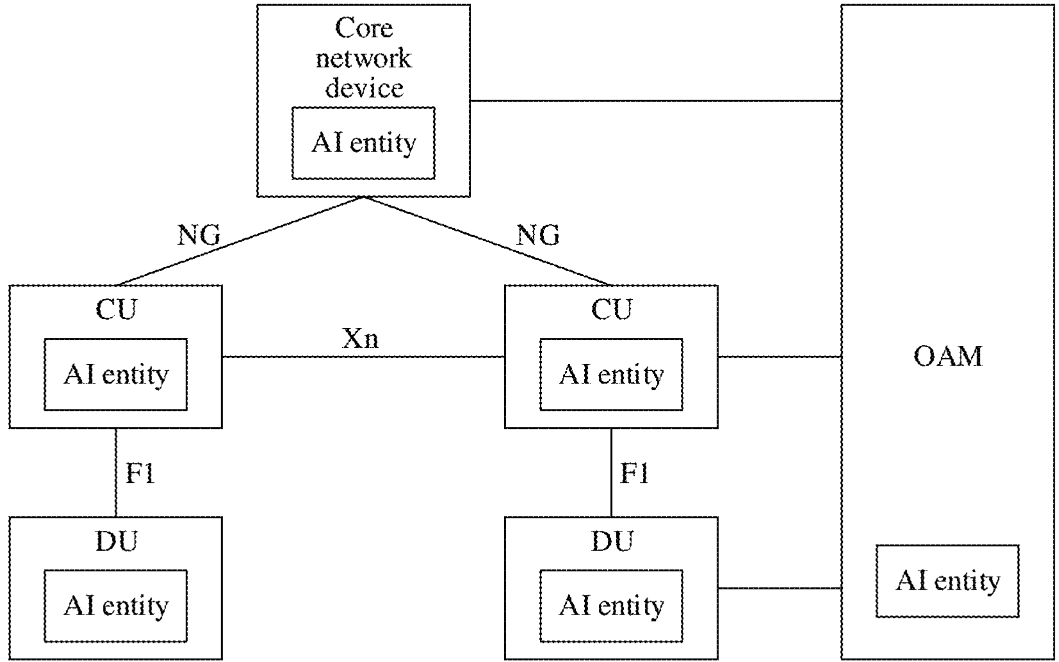

FIG. 4E is an example diagram of a network architecture to which a method according to this disclosure can be applied. Compared with FIG. 4D, an access network device in FIG. 4E is separated into a CU and a DU. Optionally, the CU may include an AI entity, and a function of the AI entity is similar to that of the near-real-time RIC. Optionally, the DU may include an AI entity, and a function of the AI entity is similar to that of the near-real-time RIC. When the CU and the DU each include an AI entity, models obtained by training by the AI entities of the CU and the DU are different, and/or models used for inference are different. Optionally, the CU in FIG. 4E may be further split into a CU-CP and a CU-UP. Optionally, one or more AI models may be deployed in the CU-CP. Optionally, one or more AI models may be deployed in the CU-UP.

In FIG. 4D or FIG. 4E, the OAM of the access network device and the OAM of the core network device are uniformly deployed. Alternatively, as described above, in FIG. 4D or FIG. 4E, the OAM of the access network device and the OAM of the core network device may be separately deployed.

In this disclosure, one model may obtain one output through inference, and the output includes one or more parameters. Learning processes or training processes of different models may be deployed in different devices or nodes, or may be deployed in a same device or node. Inference processes of different models may be deployed in different devices or nodes, or may be deployed in a same device or node.

Optionally, the AI model includes a decoder network in an AE network. On a network side, an inference result of the decoder network is, for example, used for reconfiguration of a downlink channel matrix. Optionally, the AI model includes an encoder network in an AE network. Model information of the encoder network may be sent to UE for inference.

It should be noted that, in the frameworks in FIG. 4A to FIG. 4D, the AI model may be referred to as a model, a network model, or the like for short, and may be considered as a mapping from an input parameter (for example, an input matrix) to an output parameter (for example, an output matrix). For example, for the decoder network on the network side, the input matrix may be a matrix determined based on received CSI. Training data may include a known input matrix, or include a known input matrix and corresponding output matrix, and is used to train the AI model. The training data may be data from an access network device, a CU, a CU-CP, a CU-UP, a DU, an RU, UE, and/or another entity, and/or data obtained through inference by using an AI technology. This is not limited. Inference data includes an input matrix, and is used to infer an output matrix by using the model. The inference data may be data from an access network device, a CU, a CU-CP, a CU-UP, a DU, an RU, UE, and/or another entity. An inferred matrix may be considered as policy information, and is sent to a subject of action. The matrix obtained through inference may be sent to an access network device, a CU, a CU-CP, a CU-UP, a DU, an RU, or UE for further processing, for example, for reconfiguration of a downlink channel matrix.

In this disclosure, on the network side, the decoder network in the AE network may be deployed in an access network device (such as a base station) or outside an access network device, for example, deployed in OAM, an AI network element, a core network device, an RU, a DU, or a near-real-time RIC. This is not limited. The inference result of the decoder network may be obtained through inference performed by the access network device, or may be sent to the access network device after the non-real-time RIC performs inference. For brevity of descriptions, this disclosure is described by using an example in which a decoder network is deployed in an access network device.

In this disclosure, an encoder network in an AE network is deployed in UE, and the UE may perform inference by using the encoder network.

The following describes the method provided in this disclosure with reference to the accompanying drawings. Steps or operations included in the methods are merely examples, and other operations or variations of various operations may be further performed in this disclosure. In addition, the steps may be performed in a sequence different from a sequence presented in this disclosure, and not all the operations in this disclosure may be performed.

Figure 5:
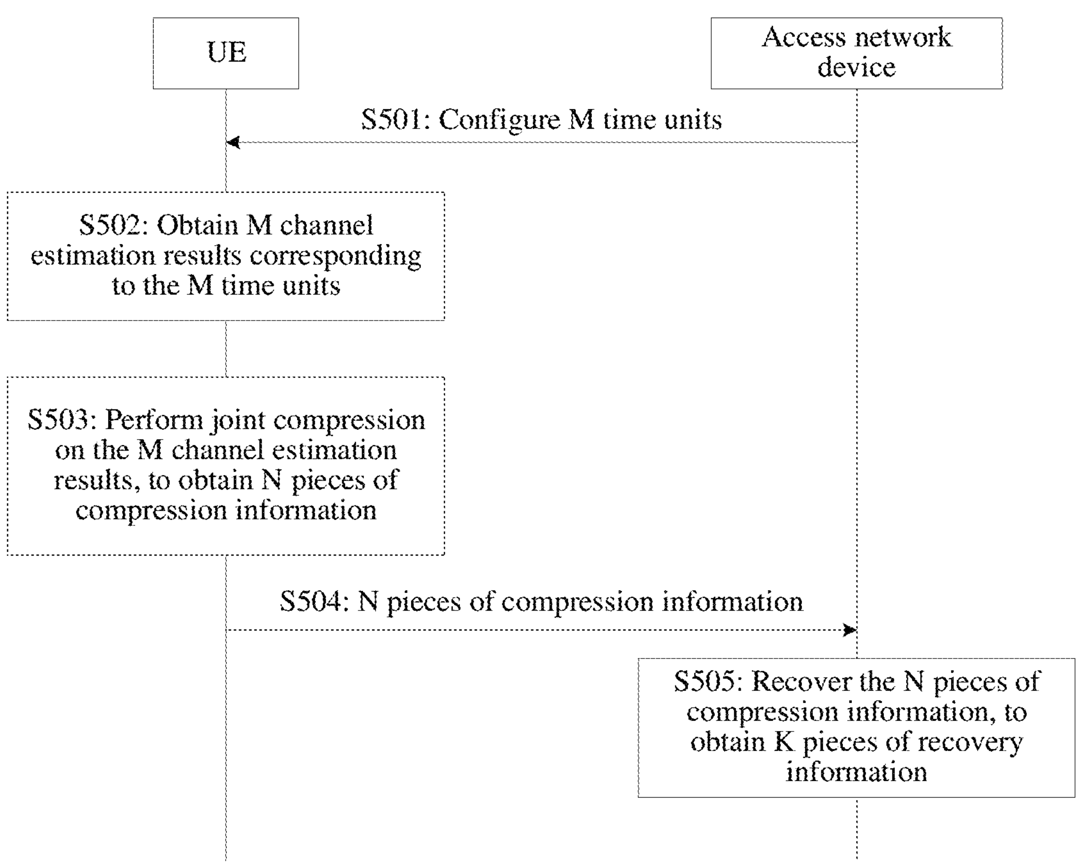
FIG. 5 is a flowchart of a communication method.

FIG. 5 is a flowchart of a communication method according to this disclosure.

Optionally, S501: An access network device sends configuration information to UE. Correspondingly, the UE receives the configuration information from the access network device.

The configuration information may have another name, for example, may be referred to as CSI feedback configuration information or feedback configuration information. The name is not limited in this disclosure. The configuration information may be used to configure M time units, and M is an integer greater than 1. The M time units are time units in which downlink channel information that the UE needs to feed back is located. In other words, the UE needs to feed back the downlink channel information in the M time units. M is greater than 1, that is, the UE may feed back the downlink channel information in a plurality of time units to the access network device. The M time units may be consecutive, that is, the M time units are consecutive duration. In this case, it may also be considered that the M time units are one time window, for example, are referred to as a first time window. In other words, the configuration information is used to configure the first time window. Alternatively, the M time units may be discrete. For example, at least two adjacent time units in the M time units are inconsecutive. For example, the time unit is a subframe (subframe), a slot (slot), a mini-slot (mini-slot), or an orthogonal frequency-division multiplexing (orthogonal frequency-division multiplexing, OFDM) symbol (symbol). In this disclosure, an example in which the time unit is a slot is used. Therefore, the "slot" is used for descriptions below. In other words, the "slot" in the following may be replaced with the "time unit".

A start time-domain location of the M slots may be located before a current time-domain location, or after a current time-domain location, or may be a current time-domain location. The current time-domain location is, for example, a time-domain location at which the UE receives the configuration information. In other words, downlink channels in the M slots may include one or more of a historical downlink channel, a current downlink channel, and a future downlink channel.

For example, the configuration information includes one or more of the following: a start time-domain location of the M slots, an end time-domain location of the M slots, duration of the M slots, numbers of the M slots, a sampling period in the M slots, a quantity of sampling points in the M slots, a time-domain location of a first sampling point in the M slots, or time-domain locations of sampling points (for example, all sampling points) in the M slots. The number of the slot is, for example, a number of the slot in a subframe, or a number of the slot in a radio frame (radio frame). The sampling point is a sampling moment at which the UE needs to estimate a downlink channel at the sampling point. The first sampling point in the M slots is a first sampling point in the M slots in time domain. For example, the sampling point is represented by using a slot, and one sampling point corresponds to one slot. The UE performs channel estimation on a downlink channel at a sampling point, that is, performs information estimation on the downlink channel in the slot. Alternatively, the sampling point may be represented by using an OFDM symbol.

For example, if the configuration information includes the start time-domain location of the M slots, the end time-domain location of the M slots, and the sampling period in the M slots, the UE may determine a location of a sampling point in the M slots based on the configuration information, to perform channel estimation on a downlink channel at the sampling point. For another example, if the configuration information includes the start time-domain location (or the end time-domain location) of the M slots, duration of the M slots, and the sampling period in the M slots, the UE may determine a location of a sampling point in the M slots based on the configuration information, to perform channel estimation on a downlink channel at the sampling point. For another example, if the configuration information includes the start time-domain location (or the end time-domain location) of the M slots, the sampling period in the M slots, and the quantity of sampling points, the UE may determine a location of a sampling point based on the configuration information, to perform channel estimation on a downlink channel at the sampling point. For another example, if the configuration information includes the start time-domain location of the M slots, the duration of the M slots, and the quantity of sampling points in the M slots, the UE may determine a location of a sampling point based on the configuration information, to perform channel estimation on a downlink channel at the sampling point. For example, the M slots are consecutive, the configuration information includes a quantity M of sampling points in the M slots, the start time-domain location of the M slots is $n_1$, and the duration of the M slots is T. In this case, the UE may determine that the sampling period in the M slots is T/M, so that the time-domain locations of the sampling points in the M slots are $[n_1, n_1+T/M, n_1+2T/M, \ldots, n_1+(N-1)T/M]$. The foregoing several configuration manners are applicable to a case in which the M slots are consecutive.

For example, if the configuration information includes the numbers of the M slots, the time-domain location of the first sampling point in the M slots, and the sampling period in the M slots, the UE may determine the time-domain locations of the M slots based on the numbers of the M slots, and then may determine a time-domain location of each sampling point in the M slots based on the time-domain location of the first sampling point in the M slots and the sampling period, to perform channel estimation on a downlink channel at the sampling point. The configuration manner is applicable to a case in which the M slots are discrete.

For example, if the configuration information includes the time-domain locations of the sampling points in the M slots, the UE may perform channel estimation on a downlink channel at a sampling point based on the configuration information. The configuration manner is applicable to both a case in which the M slots are discrete and a case in which the M slots are consecutive.

Optionally, one or more of the following information may be predefined in a protocol, preconfigured in the UE, or use a default value: the start time-domain location of the M slots, the end time-domain location of the M slots, the duration of the M slots, the numbers of the M slots, the sampling period in the M slots, the quantity of sampling points in the M slots, or the time-domain locations of the sampling points in the M slots. For example, if the start time-domain location of the M slots is predefined in a protocol, a first offset is predefined in the protocol. For example, the start time-domain location of the M slots is a time-domain location obtained by adding the first offset to a moment at which the UE receives the configuration information, and the first offset is a real number. For another example, the sampling period in the M slots is predefined in the protocol as one transmission time interval (transmission time interval, TTI). For another example, the duration of the M slots is duration of a shortest time window including required sampling points by default. For another example, the quantity of sampling points in the M slots is P by default, and P is a real number. One TTI may be one or more subframes, one or more slots, one or more symbols, or another possible configuration. This is not limited.

The UE may determine the M slots based on the configuration information and information predefined in the protocol (or information preconfigured in the UE, or default information). For example, the configuration information includes that the start time-domain location of the M slots is $n_1$, the duration is T, and the sampling period in the M slots predefined in the protocol is one TTI. In this case, the UE may determine a time-domain location of a sampling point in the M slots based on $n_1$, T, and the sampling period, to perform channel estimation on a downlink channel at the sampling point.

Alternatively, the UE may determine the M slots based on the information predefined in the protocol (or the information preconfigured in the UE, or the default information), and the access network device does not need to send the configuration information. Therefore, S501 is an optional step.

Optionally, the access network device may further send, to the UE, information used to configure a reference signal. For example, the information may be referred to as reference signal configuration information. The information may be used to configure a time-domain resource, a frequency-domain resource, and/or the like of the reference signal, and the UE may detect the reference signal from the access network device based on the information. The access network device may carry the information and the configuration information that is used to configure the M slots in one message for sending, or may separately send the information and the configuration information that is used to configure the M slots. If the access network device separately sends the information and the configuration information that is used to configure the M slots, the two pieces of information may be simultaneously sent, or the information may be first sent, or the configuration information that is used to configure the M slots may be first sent.

Optionally, the access network device further sends a downlink reference signal to the UE, and the UE may receive the downlink reference signal based on information used to configure the downlink reference signal, and perform channel estimation on a downlink channel based on the downlink reference signal. The access network device may send the downlink reference signal to the UE in the M slots, or the access network device may send the downlink reference signal to the UE before the start time-domain location of the M slots arrives, or the access network device may send the downlink reference signal to the UE before the start time-domain location of the M slots arrives and in the M slots. The downlink reference signal is, for example, a synchronization signal and physical broadcast channel block (synchronization signal and physical broadcast channel (PBCH) block, SSB), or a channel state information reference signal (channel state information reference signal, CSI-RS).

S502: The UE obtains M channel estimation results. The M channel estimation results correspond to the M time units. For example, the M channel estimation results can reflect characteristics of the downlink channels in the M time units.

The UE may determine the time-domain locations of the sampling points in the M slots based on the configuration information and/or the information used to configure the reference signal, so that the UE performs channel estimation on a downlink channel at the sampling point. For example, the sampling point is represented by using a slot. In this disclosure, that one slot corresponds to one sampling point is used as an example. In this case, the M slots may correspond to the M sampling points. The UE performs channel estimation on a downlink channel at one sampling point, and may obtain a channel estimation result. In this case, the UE performs channel estimation on downlink channels at the M sampling points, and may obtain the M channel estimation results.

For example, if one of the M channel estimation results is referred to as a first channel estimation result, the first channel estimation result may be a channel estimation result obtained by the UE by performing measurement based on a received downlink reference signal. For example, the access network device may send the downlink reference signal to the UE in the M slots, or the access network device may send the downlink reference signal to the UE before the start time-domain location of the M slots arrives, or the access network device may send the downlink reference signal to the UE before the start time-domain location of the M slots arrives and in the M slots. The UE may receive the downlink reference signal in the M slots, or may receive the downlink reference signal before the start time-domain location of the M slots arrives, or may receive the downlink reference signal before the start time-domain location of the M slots arrives and in the M slots. The time-domain location at which the UE receives the downlink reference signal is not limited in this disclosure. If a time-domain location of a sampling point in the M slots is a current time-domain location, or is before a current time-domain location, the UE may measure the downlink reference signal regardless of a specific time-domain location or specific time-domain locations at which the UE receives the downlink reference signal, to obtain a channel estimation result at the sampling point.

Alternatively, the first channel estimation result may be a processing result obtained by the UE by processing a second channel estimation result, and the second channel estimation result is obtained by the UE by measuring the received downlink reference signal. In other words, the first channel estimation result is obtained after the UE processes the obtained channel estimation result. For example, a time-domain location of a sampling point in the M slots is a time-domain location after a current time-domain location, that is, the time-domain location of the sampling point is not arrived. If the UE performs channel estimation when the time-domain location of the sampling point arrives, a previously obtained channel estimation result may be invalid due to excessively long waiting time. Alternatively, in the M slots, the UE measures only downlink reference signal in some slots. Therefore, in a processing manner, the UE may process the obtained channel estimation result, to obtain a channel estimation result of a future slot or an unmeasured slot, or the UE may obtain a channel estimation result of a future time unit or an unmeasured time unit through prediction. In this way, the UE may obtain channel estimation results of more slots in a timely manner, to reduce waiting time and improve channel information feedback efficiency. For a process in which the UE measures the received downlink reference signal to obtain the second channel estimation result, refer to the descriptions in the foregoing paragraph. After obtaining the second channel estimation result, the UE may process the second channel estimation result, and the processing result may be used as the first channel estimation result.

For example, the first channel estimation result may be obtained by using a convolution of the second channel estimation result and a shaped waveform. It is assumed that the M first channel estimation results are represented as $H_{n_1}$, $H_{n_2}$, $H_{n_3}$, . . . , and $H_{n_M}$, and there are a total of M' second channel estimation results. The M' second channel estimation results are represented as $H_{e_1}$, $H_{e_2}$, $H_{e_3}$, . . . , and, $H_{e_{M'}}$, and the first channel estimation result may meet the following relationship:

$$H_{n_j} = \sum_{m=1}^{M'} H_{e_m} g_j(m) \quad \text{(Formula 1)}$$

In Formula 1, j is an integer ranging from 1 to M, and $g_j(m)$ represents a coefficient of a shaped waveform. Particularly, if the M' second channel estimation results are channel estimation results obtained through measurement at equal intervals, and a measurement period is T, then $g_j(m)=\bar{g}(n_j-Tm)$, where $\bar{g}$ is a function that does not change with j.

Alternatively, the first channel estimation result may be a channel estimation result obtained through prediction by the UE. As described above, if a time-domain location of a sampling point in the M slots is a time-domain location after a current time-domain location, the UE may obtain a channel estimation result of a future sampling point through corresponding processing, and prediction is another processing manner.

For example, the UE may predict the first channel estimation result by using a prony (prony) algorithm. For example, the UE may perform weighted summation on channel estimation results of b slots from an $(n-b)^{th}$ slot to an $(n-1)^{th}$ slot, to obtain a first channel estimation result of an $n^{th}$ slot. Alternatively, the UE may perform channel prediction by using a long short-term memory (long short-term memory, LSTM) artificial neural network, to obtain the first channel estimation result. An input of the LSTM is, for example, the channel estimation results of the b slots from the $(n-b)^{th}$ slot to the $(n-1)^{th}$ slot, and an output of the LSTM is, for example, the first channel estimation result of the $n^{th}$ slot. Optionally, a parameter of the LSTM may be obtained through training by using a neural network optimizer such as an Adam optimizer (adam optimizer). In this case, b is a positive integer. For example, b may be equal to 2 or 4, or may be another value.

The first channel estimation result may be obtained in the foregoing three possible implementations. Therefore, the M channel estimation results may include one or more of the following: a channel estimation result obtained by performing measurement based on a received downlink reference signal; a processing result obtained by processing an existing channel estimation result, or a channel estimation result obtained through prediction. Manners of determining different channel estimation results may be the same, or may be different. This is not limited. For example, $M_1$ channel estimation results in the M channel estimation results are obtained by performing measurement based on the received downlink reference signal, and the other M-$M_1$ channel estimation results are processing results obtained by processing the $M_1$ channel estimation results. $M_1$ is an integer greater than 0 and less than M. For brevity of descriptions, examples are not provided one by one.

S503: The UE performs joint compression on the M channel estimation results, to obtain N pieces of compression information. N is a positive integer.

In this disclosure, the UE may jointly compress the M channel estimation results by using an encoder network. In view of this, the UE needs to first determine the encoder network to be used.

In a technology in which CSI feedback is performed with reference to a neural network, a typical neural network architecture is a dual architecture. An auto-encoder is used as an example. Compressed transmission may be implemented through joint optimization of an encoder and a decoder. For example, one or more groups of (or referred to as one or more) reference networks may be obtained through training, and the reference networks may be encoder networks (or referred to as reference encoder networks)-decoder networks (or referred to as reference decoder networks) that appear in pairs. That is, a group of reference networks may include a reference encoder network and a corresponding reference decoder network. The reference networks may be trained offline or trained online. If the training is performed offline, the training can be specified in a protocol. For example, the protocol may provide parameters such as a network structure and/or a weight of one or more reference networks (including a reference encoder network and a reference decoder network). The UE or the access network device may implement the reference networks with reference to the protocol. Optionally, the protocol may provide evaluation performance corresponding to the specific reference networks in an agreed data set.

If there is a plurality of groups of reference networks, the access network device may indicate, to the UE for use, a specific group of reference networks or a reference encoder network in a specific group of reference networks. For example, the access network device sends first indication information to the UE, where the first indication information may indicate parameter information of the encoder network. The first indication information indicates the parameter information of the encoder network. In an indication manner, the first indication information includes the parameter information of the encoder network, and the parameter information of the encoder network includes, for example, parameters such as a structure and/or a weight of the encoder network. The encoder network indicated by the first indication information is, for example, a reference encoder network, and the UE may determine a corresponding reference encoder network based on the first indication information. Alternatively, the first indication information may indicate an index of an encoder network (for example, an index of a reference encoder network), or an index of a reference network, and the UE may also determine a corresponding reference encoder network based on the first indication information. After determining the reference encoder network, the UE may directly use the determined reference encoder network. In other words, the reference encoder network is the encoder network finally used by the UE. Alternatively, after determining the reference encoder network, the UE does not directly use the reference encoder network, but a characteristic of an encoder network finally used by the UE may be determined based on a characteristic of the reference encoder network. For example, an input dimension of the encoder network used by the UE may be determined based on an input dimension of the reference encoder network. For example, the input dimension of the encoder network used by the UE is the same as the input dimension of the reference encoder network. Similarly, for example, an output dimension of the encoder network used by the UE may also be determined based on an output dimension of the reference encoder network. For example, the output dimension of the encoder network used by the UE is the same as the output dimension of the reference encoder network. For example, when the input of the encoder network used by the UE is the same as the input of the reference encoder network, a difference between the output of the encoder network used by the UE and the output of the reference encoder network is less than a threshold.

Alternatively, the UE may select a specific group of reference networks or a reference encoder network in a specific group of reference networks by the UE. For example, the UE may select one of a plurality of group of reference networks based on factors such as evaluation performance of the reference networks, where the reference networks include a reference encoder network. After the reference encoder network is determined, for how the UE determines the used encoder network, refer to the descriptions in the previous paragraphs. If the UE determines the reference encoder network, the UE may send second indication information to the access network device, where the second indication information may indicate parameter information of the encoder network selected by the UE. If the encoder network finally used by the UE is not the same as a reference encoder network, the second indication information may indicate parameter information of the reference encoder network. The access network device may determine, based on the parameter information of the reference encoder network, a reference network to which the reference encoder network belongs, to determine a reference decoder network included in the reference network. Alternatively, the second indication information may indicate parameter information of a reference network selected by the UE, and the access network device may determine, based on the parameter information of the reference network, a reference decoder network included in the reference network. Alternatively, the second indication information may indicate an index of the encoder network selected by the UE. If the encoder network finally used by the UE is not the same as a reference encoder network, the second indication information may indicate an index of the reference encoder network or an index of the reference network, so that the access network device can determine a corresponding reference decoder network. The second indication information needs to indicate parameter information of a network. In an indication manner, the second indication information includes the parameter information of the network. For example, if the second indication information indicates parameter information of a reference encoder network, the second indication information may specifically include parameter information of the reference encoder network, for example, include parameters such as a structure and/or a weight of the encoder network. The second indication information needs to indicate an index of a network. In an indication manner, the second indication information includes the index of the network. For example, if the second indication information indicates an index of a reference encoder network, the second indication information may specifically include the index of the reference encoder network.

Regardless of whether the access network device sends the first indication information to the UE or the UE sends the second indication information to the access network device, if the parameter information of the encoder network (or the reference encoder network, or the reference network) is sent, to reduce transmission overheads, optionally, a transmitting end (the access network device or the UE) may compress the parameter information of the encoder network (or the reference encoder network, or the reference network), and the first indication information or the second indication information may include the compressed parameter information. The compression includes but is not limited to one or more of model pruning, model distillation, model quantization, or the like. Model pruning indicates to send some parameter information of an encoder network (or a reference encoder network, or a reference network) to UE, but not to send remaining parameter information. The UE obtains only some parameter information of the encoder network (or the reference encoder network, or the reference network), and does not obtain all parameter information. This is equivalent to pruning some parameters, to reduce transmission overheads. Model distillation indicates to obtain a first model based on parameter information of an encoder network (or a reference encoder network, or a reference network). A scale of the first model is less than a scale of the encoder network (or the reference encoder network, or the reference network). It may be understood that the encoder network (or the reference encoder network, or the reference network) is a large-scale model, and the encoder network (or the reference encoder network, or the reference network) may have a large quantity of parameters. However, the first model is a small-scale model, and a quantity of parameters corresponding to the first model may be small. In this case, the first indication information or the second indication information may include the first model (or include parameter information of the first model). In this way, transmission overheads can also be reduced. After receiving the first model, a receiving end (the UE or the access network device) directly uses the first model. It may be understood that the receiving end uses the first model as the encoder network (or the reference encoder network, or the reference network). Model quantization means that parameter information of an encoder network (or a reference encoder network, or a reference network) is, for example, a floating-point number, and a transmitting end may quantize the parameter information of the encoder network (or the reference encoder network, or the reference network). The parameter information of the encoder network (or the reference encoder network, or the reference network) included in the first indication information or the second indication information may be a quantization parameter, to reduce transmission overheads.

If the UE determines the encoder network, an implementation in which the UE performs joint compression on the M channel estimation results is as follows: The UE inputs the M channel estimation results into the encoder network, and the encoder network may perform joint compression on the M channel estimation results. After joint compression, the encoder network may output N pieces of compression information. Because the N pieces of compression information are obtained by performing joint compression on the M channel estimation results, each of the N pieces of compression information corresponds to some or all of the M channel estimation results, and channel estimation results corresponding to different pieces of compression information may be the same, or may be different or not completely the same. Different pieces of compression information may correspond to a same parameter of a same channel estimation result, or different pieces of compression information may correspond to different parameters of a same channel estimation result, or different pieces of compression information may correspond to parameters that are not completely the same in a same channel estimation result. That one piece of compression information corresponds to one channel estimation result may be understood as that the compression information reflects a characteristic of the channel estimation result, or that a process of generating the compression information is related to the channel estimation result, or that the compression information corresponds to all or some parameters of the channel estimation result.

For example, M=3, the M channel estimation results are respectively a channel estimation result 1, a channel estimation result 2, and a channel estimation result 3, and the three channel estimation results all correspond to a parameter A to a parameter E; and N=3, and the N pieces of compression information are respectively compression information 1, compression information 2, and compression information 3. The compression information 1 may reflect parameters A and B corresponding to the channel estimation result 1, parameters C and D corresponding to the channel estimation result 2, and parameters A, D, and E corresponding to the channel estimation result 3. The compression information 2 may reflect parameters C and E corresponding to the channel estimation result 1, parameters C and D corresponding to the channel estimation result 2, and parameters B and C corresponding to the channel estimation result 3. The compression information 3 may reflect a parameter D corresponding to the channel estimation result 1, parameters A, B, and E corresponding to the channel estimation result 2, and parameters A and B corresponding to the channel estimation result 3. In this case, different pieces of compression information correspond to a same channel estimation result, and parameters corresponding to different pieces of compression information include the following several cases. Different pieces of compression information may correspond to same parameters of a same channel estimation result (for example, the compression information 1 corresponds to parameters C and D of the channel estimation result 2, and the compression information 2 also corresponds to the parameters C and D of the channel estimation result 2). Different pieces of compression information may correspond to different parameters of a same channel estimation result (for example, the compression information 1 corresponds to parameters A and B of the channel estimation result 1, and the compression information 2 corresponds to parameters C and E of the channel estimation result 1). Different pieces of compression information may also correspond to parameters that are not completely the same in a same channel estimation result (for example, the compression information 1 corresponds to parameters A, D, and E of the channel estimation result 3, and the compression information 3 corresponds to parameters A and B of the channel estimation result 3). In addition, in this example, for example, parameters corresponding to the M channel estimation results are all the same (that is, all the three channel estimation results correspond to the parameters A to E). Actually, parameters corresponding to different channel estimation results may be different or not completely the same. This is not limited herein. In addition, in this example, for example, parameters corresponding to the N pieces of compression information are all the same. Actually, parameters corresponding to different pieces of compression information may also be different or not completely the same. For example, N=2, compression information 1 may correspond to M parameters A of the M channel estimation results, and compression information 2 no longer corresponds to the parameter A.

Optionally, to ensure that a downlink channel recovered by the access network device is more accurate, when performing compression, the UE may not only perform joint compression on the M channel estimation results, but also perform processing on historical information. In other words, the UE may perform joint compression on the M channel estimation results and the historical information, to obtain the N pieces of compression information. The historical information includes, for example, channel estimation results corresponding to L slots before the M slots. For example, the historical information includes L channel estimation results. L is a positive integer, and the L slots may be consecutive or discrete. For example, the L slots are configured by using configuration information. For example, numbers of the L slots may be configured by using the configuration information. Alternatively, the L slots may be determined by the UE. For a manner in which the UE obtains the historical information, refer to the foregoing described manner in which the UE obtains the M channel estimation results. For example, the historical information includes the L channel estimation results. For example, the UE inputs both the M channel estimation results and the L channel estimation results into an encoder network, and the encoder network may perform joint compression on the M channel estimation results and the L channel estimation results. After joint compression, the encoder network may output N pieces of compression information. Because the N pieces of compression information are obtained by performing joint compression on the M channel estimation results and the L channel estimation results, each of the N pieces of compression information corresponds to some or all of the M channel estimation results and the L channel estimation results, and channel estimation results corresponding to different pieces of compression information may be the same, or may be different or not completely the same. Different pieces of compression information may correspond to a same parameter of a same channel estimation result, or different pieces of compression information may correspond to different parameters of a same channel estimation result, or different pieces of compression information may correspond to parameters that are not completely the same in a same channel estimation result. For this example, refer to the foregoing examples. For example, any one or two channel estimation results in the foregoing examples are considered as channel estimation results included in the historical information.

For example, a value of N may be N=1. To be specific, the UE may obtain one piece of compression information based on the M channel estimation results (or based on the M channel estimation results and the L channel estimation results).

In an implementation of the channel estimation result, the channel estimation result is channel information, and the UE may obtain one piece of compression information based on the M pieces of channel information (or based on the M pieces of channel information and the L pieces of channel information). The channel information may also be referred to as a channel response, a channel matrix, or the like. Dimensions of the channel information are, for example, $[N_{tx}, N_{rx}, N_{RB}]$, where $N_{tx}$ represents a quantity of antennas or ports of a transmitting end (for example, an access network device), $N_{rx}$ represents a quantity of antennas or ports of a receiving end (for example, UE), $N_{RB}$ represents a quantity of frequency-domain units, for example, a quantity of resource blocks (resource blocks, RBs), and $N_{tx}$, $N_{rx}$, and $N_{RB}$ are positive integers. Dimension reduction is performed on original channel information with dimensions of $[N_{tx}, N_{rx}, N_{RB}]$ by using singular value decomposition (singular value decomposition, SVD), to obtain an eigen-subspace matrix of a downlink channel, where dimensions of the eigen-subspace matrix are $[N_{tx}, N_{sb}]$. $N_{sb}$ represents a quantity of frequency-domain sub-bands, for example, $N_{sb}=N_{RB}/a$, where a represents a granularity of the frequency-domain sub-band or a sub-band bandwidth, that is, a quantity of RBs included in each sub-band. A common granularity of the frequency-domain sub-band is 1 RB, 2 RBs, or 4 RBs. If the granularity is 4 RBs, $N_{sb}=N_{RB}$. One RB includes a positive integer quantity of sub-carriers, for example, includes 12 or 16 sub-carriers. When performing dimension reduction on the channel information by using SVD, the UE may process different ranks (ranks), where different ranks may also be understood as different streams or different layers (layers). One piece of channel information (or one channel estimation result) may correspond to one or more layers. The following describes a processing process of the UE for an $L'^{th}$ layer, where L' is a positive integer.

If each sub-band at the $L'^{th}$ layer includes a RBs, the UE may calculate an equivalent downlink channel based on downlink channels of a RBs. Assuming that a downlink channel of an $i^{th}$ RB in a sub-band is $H_i$, an equivalent downlink channel in the sub-band may be represented as:

$$\tilde{R_{UU}} = \sum_{i=0}^{a-1} H_i{}^H H_i \quad \text{(Formula 2)}$$

The UE performs SVD decomposition on $\widetilde{R_{UU}}$, to obtain:

$$[U\lambda\tilde{V}] = SVD(\tilde{R_{UU}}) \quad \text{(Formula 3)}$$

That is, $$\tilde{R_{UU}} = U\lambda\tilde{V}^H.$$

In Formula 2 and Formula 3, dimensions of $H_i$ are $[N_{tx}, N_{rx}]$, where $H_i^H$ represents a conjugate transpose of $H_i$, dimensions of $\widetilde{R_{UU}}$ are $[N_{tx}, N_{tx}]$, a value of an eigenvector is an $L'^{th}$ column of $\tilde{V}$, and dimensions of the eigenvector are $(N_{tx}, 1)$, that is, an eigenvector of an $m^{th}$ sub-band is $V_m=\tilde{V}(:, L')$. The eigenvector may be used as a precoding vector in the $m^{th}$ sub-band at the $L'^{th}$ layer.

The UE combines eigenvectors of all the sub-bands at the $L'^{th}$ layer to obtain an eigen-subspace matrix $V=[V_1\ V_2 \ldots V_{Nsb}]$, where V is a complex matrix with dimensions of $[N_{tx}, N_{sb}]$. Two groups of DFT bases can be generated by discrete fourier transform (discrete fourier transform, DFT), namely, spatial bases $S \in \mathcal{C}^{N_{tx}*N_{tx}}$ and frequency bases $F \in \mathcal{C}^{N_{sb}*N_{sb}}$. The spatial bases are $N_{tx}$ DFT-column vectors of $N_{tx}*1$, and the frequency bases are $N_{sb}$ DFT-column vectors of $N_{sb}*1$. The UE may perform space-frequency joint projection on the eigen-subspace matrix based on the spatial bases and the frequency bases. For a manner of the space-frequency joint projection, refer to the following formula:

$$C_{complex} = S^H * V * F,\ C_{complex} \in C^{N_{tx}*N_{sb}} \quad \text{(Formula 4)}$$

$S^H$ is a hermitian (hermitian) matrix of S, which is also referred to as a self-adjoint matrix, and may be obtained by performing conjugate transpose on the matrix S. S represents a spatial base, and a specific form of S is related to an antenna panel. Assuming that the antenna panel is dual-polarized, with a horizontal element being Nh, and a vertical element being Nv, a representation form of S is obtained as follows:

$$S = \begin{bmatrix} kron(DFT(Nv), DFT(Nh)) & 0 \\ 0 & kron(DFT(Nv), DFT(Nh)) \end{bmatrix} \quad \text{(Formula 5)}$$

F represents a frequency base, and a representation form of F is related to a sub-band $N_{sb}$. For example, F may satisfy the following formula:

$$F = DFT(N_{sb}) \quad \text{(Formula 6)}$$

Optionally, in a DFT process, an oversampling factor may be further added. For example, a plurality of groups of orthogonal spatial bases $\{S_1, S_2, S_3 \ldots\}$ and a plurality of groups of orthogonal frequency bases $\{F_1, F_2, F_3 \ldots\}$ may be generated in an oversampling manner, and one group of $S_i$ and $F_j$ are selected from the groups as the spatial base and the frequency base of this disclosure. For example, a group with a more accurate projection direction may be selected from the groups. For example, the oversampling factors in both space domain and frequency domain are 4.

The complex matrix $C_{complex}$ obtained by performing the foregoing operations is a sparse representation of the eigen-subspace of an original channel, and dimensions of the complex matrix are consistent with dimensions of the eigen-subspace matrix before projection, and are $[N_{tx}, N_{sb}]$. One channel estimation result may correspond to one or more layers, and one complex matrix $C_{complex}$ may be obtained by processing one layer, and then a plurality of complex matrices $C_{complex}$ may be obtained based on one channel estimation result. The UE may input all complex matrices $C_{complex}$ corresponding to the M channel estimation results (or the M channel estimation results and the L channel estimation results) into the encoder network, or the UE may perform corresponding processing (for example, convert the complex matrix into a three-dimensional real-valued tensor) on each complex matrix $C_{complex}$ corresponding to the M channel estimation results (or the M channel estimation results and the L channel estimation results) and then input the complex matrices into the encoder network. A process of converting the complex matrix $C_{complex}$ into a three-dimensional real-valued tensor is described below.

In another implementation of the channel estimation result, the channel estimation result is an eigenvector, and the UE may obtain one piece of compression information based on the M eigenvectors (or based on the M eigenvectors and the L eigenvectors). If the channel estimation result is an eigenvector, each layer has an eigen-subspace matrix $V=[V_1\ V_2\ \dots\ V_{Nsb}]$, where V is a complex matrix with dimensions of $[N_{tx}, N_{sb}]$. The UE may perform data preprocessing on the eigen-subspace matrix at each layer. For example, an operation process of performing data preprocessing on an eigen-subspace matrix at a layer is as follows.

The UE may generate two groups of DFT bases by using a DFT formula: spatial bases $S \in \mathcal{C}^{N_{tx}*N_{tx}}$ and frequency bases $F \in \mathcal{C}^{N_{sb}*N_{sb}}$, where the spatial bases are DFT-column vectors of $N_{tx}*1$, and the frequency bases are $N_{sb}$ DFT-column vectors of $N_{sb}*1$. The UE may perform space-frequency joint projection on the eigen-subspace matrix based on the spatial bases and the frequency bases. For a manner of the space-frequency joint projection, refer to Formula 4. In addition, for a representation form of S, refer to Formula 5. For descriptions of F, refer to the foregoing descriptions (for example, Formula 6).

Optionally, in a DFT process, an oversampling factor may be further added. For details, refer to the foregoing descriptions.

The UE may obtain a complex matrix $C_{complex}$ based on one channel estimation result, and may obtain M complex matrices $C_{complex}$ based on the M channel estimation results. If there are still L channel estimation results, the UE may further obtain L complex matrices $C_{complex}$ based on the L channel estimation results. After obtaining the complex matrix $C_{complex}$, the UE may directly input the obtained complex matrix $C_{complex}$ into the encoder network, or the UE may perform corresponding processing on the obtained complex matrix and then input the obtained complex matrix into the encoder network. For example, in a processing manner, the UE converts each complex matrix $C_{complex}$ into a three-dimensional real-valued tensor, and then inputs the obtained three-dimensional real-valued tensor into the encoder network. For example, for a complex matrix $C_{complex}$, the UE extracts a real part of each element in $C_{complex}$, to obtain a real matrix with dimensions of $[N_{tx}, N_{sb}]$. Similarly, the UE may extract an imaginary part of each element in $C_{complex}$, to obtain a real matrix with dimensions of $[N_{tx}, N_{sb}]$. Further, the UE may concatenate the two real matrices into a tensor H whose dimension is $[2, N_{tx}, N_{sb}]$, that is, $H[0]=\text{real}(C_{complex})$, $H[1]=\text{imag}(C_{complex})$, and the tensor H is a three-dimensional real-valued tensor.

The foregoing process of determining the channel estimation result is merely used as an example. In this disclosure, channel estimation may be performed in another possible manner. This is not limited.

Figure 6A:
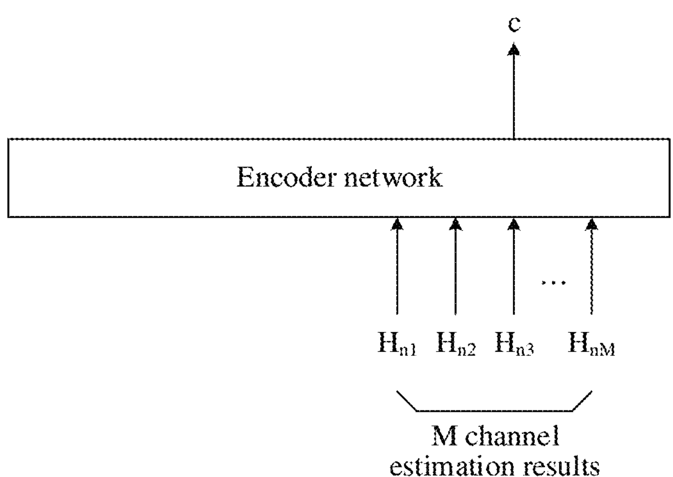
FIG. 6A to FIG. 6H are diagrams of several input and output scenarios of an encoder network.

For example, FIG. 6A shows an example of an input and output scenario of an encoder network. FIG. 6A uses an example in which input information of an encoder network does not include historical information. In FIG. 6A, $H_{n_1}$, $H_{n_2}$, $H_{n_3}$, . . . , and $H_{n_M}$ represent the M channel estimation results input to the encoder network, and c represents a single piece of compression information output by the encoder network.

Figure 6B:
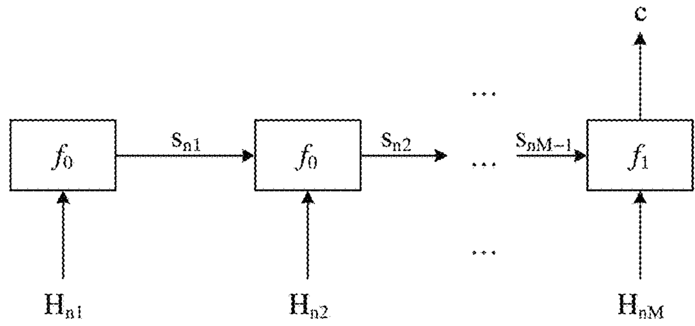

Optionally, for an implementation in which $H_{n_1}$, $H_{n_2}$, $H_{n_3}$, . . . , and $H_{n_M}$ are mapped to c, refer to FIG. 6B. A calculation process involved in FIG. 6B may be expressed as follows:

$$s_{n_1} = f_0(H_{n_1}, 0) \quad \text{(Formula 7)}$$

$$s_{n_i} = f_0(H_{n_i}, s_{n_{i-1}}),\ 2 \le i \le M-1 \quad \text{(Formula 8)}$$

$$c = f_1(H_{n_M}, s_{n_{M-1}}) \quad \text{(Formula 9)}$$

The finally output compression information c is a real vector with [C, 1] dimensions, where C represents a length of the compression information, and may be obtained based on a requirement on feedback overheads.

Figure 6C:
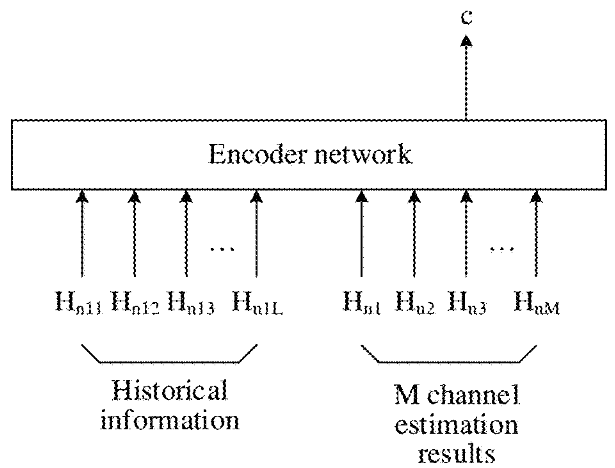

Further, FIG. 6C shows an example of an input and output scenario of an encoder network. FIG. 6C uses an example in which input information of an encoder network includes historical information. In FIG. 6C, $H_{n_1}$, $H_{n_2}$, $H_{n_3}$, . . . , and $H_{n_M}$ represent the M channel estimation results input to the encoder network, $H_{n_{11}}$, $H_{n_{12}}$, $H_{n_{13}}$, . . . , and $H_{n_{1L}}$ represent the L channel estimation results input to the encoder network, and c represents a single piece of compression information output by the encoder network.

Figure 6D:
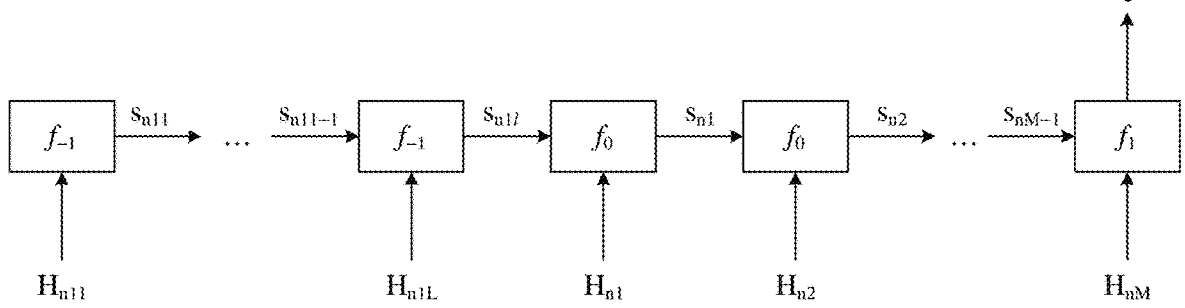

Optionally, for an implementation in which $H_{n_{11}}$, $H_{n_{12}}$, $H_{n_{13}}$, . . . , and $H_{n_{1L}}$, $H_{n_1}$, $H_{n_2}$, $H_{n_3}$, . . . , and $H_{n_M}$ are mapped to c, refer to FIG. 6D. A calculation process involved in FIG. 6D may be expressed as follows:

$$s_{n_{11}} = f_{-1}(H_{n_{11}}, 0) \quad \text{(Formula 10)}$$

$$s_{n_{1i}} = f_{-1}(H_{n_{1i}}, s_{n_{1i-1}}),\ 2 \le i \le L \quad \text{(Formula 11)}$$

$$s_{n_0} = f_0(H_{n_0}, s_{n_{1L}}) \quad \text{(Formula 12)}$$

$$s_{n_i} = f_0(H_{n_i}, s_{n_{i-1}}),\ 2 \le i \le M-1 \quad \text{(Formula 13)}$$

$$c = f_1(H_{n_M}, s_{n_{M-1}}) \quad \text{(Formula 14)}$$

The finally output compression information c is a real vector with [C, 1] dimensions.

In this case, the UE may obtain one piece of compression information by using the encoder network. To be specific, for downlink channels in the M slots, the UE may represent the downlink channels by using one piece of compression information. The UE needs to send only one piece of compression information to the access network device. In addition, because the compression information can reflect characteristics of the downlink channels in the M slots, the UE does not need to send the compression information in each slot. In this way, transmission overheads can be reduced to a large extent. In addition, the compression information is obtained by performing joint compression on the M channel estimation results (or the M channel estimation results and the L channel estimation results), and can reflect a status of the downlink channels in the M slots. In addition, the downlink channels are correlated in time domain. The compression information can better reflect a related status of the downlink channels in time domain, so that the access network device can recover a more accurate downlink channel based on the compression information.

For another example, a value of N may be N>1. To be specific, the UE may obtain a plurality of pieces of compression information based on M channel estimation results (or based on the M channel estimation results and the L channel estimation results). When N is greater than 1, N may be equal to M, or less than M, or may be greater than M. It can be learned that, a quantity of channel estimation results input by the encoder network may be equal to or not equal to a quantity of pieces of compression information output by the encoder network, so that a channel compression process is more flexible. Even if N is greater than 1, each of the N pieces of compression information corresponds to the M channel estimation results, or corresponds to the M channel estimation results and the L channel estimation results. The value of N is related to a change speed of the downlink channel. In a low-speed scenario (for example, in a 3GPP channel model, an indoor speed is 3 km/h (80%), and an outdoor speed is 30 km/h (20%)), N=M=10 is a proper value. In this case, the M consecutive channel estimation results change slightly, and a change rule of the M consecutive channel estimation results has been learned by the network for channel compression. If N=M, the network structure is better designed.

Figure 6E:
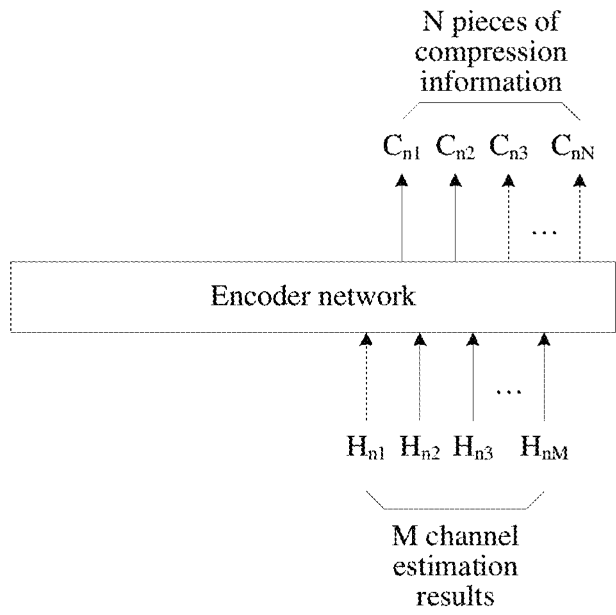

For example, FIG. 6E shows an example of an input and output scenario of an encoder network. FIG. 6E uses an example in which input information of an encoder network does not include historical information. In FIG. 6E, $H_{n_1}$, $H_{n_2}$, $H_{n_3}$, . . . , and $H_{n_M}$ represent the M channel estimation results input to the encoder network, and $C_{n_1}$, $C_{n_2}$, $C_{n_3}$, . . . , and $C_{n_N}$ represent the N pieces of compression information output by the encoder network.

Figure 6F:
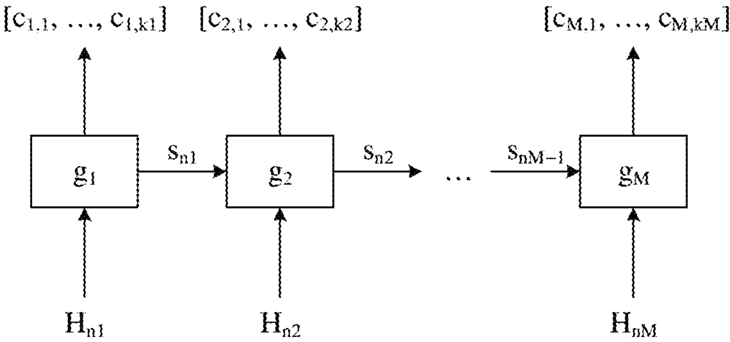

Optionally, for an implementation in which $H_{n_1}$, $H_{n_2}$, $H_{n_3}$, . . . , and $H_{n_M}$ are mapped to $C_{n_1}$, $C_{n_2}$, $C_{n_3}$, . . . , and $C_{n_N}$, refer to FIG. 6F. A calculation process involved in FIG. 6F may be expressed as follows:

$$[c_{1,1}, \ldots, c_{1,k_1}, s_{n_1}] = g_1(H_{n_1}, 0) \quad \text{(Formula 15)}$$

$$[c_{i,1}, \ldots, c_{i,k_i}, s_{n_i}] = g_i(H_{n_i}, s_{n_{i-1}}),\ 2 \le i \le M-1 \quad \text{(Formula 16)}$$

$$[c_{M,1}, \ldots, c_{M,k_M}] = g_M(H_{n_M}, s_{n_{M-1}}) \quad \text{(Formula 17)}$$

$[c_{i,1}, \ldots, c_{i,k_i}]$ represents $k_i(k_i \ge 0)$ outputs of an $i^{th}$ module, and $\Sigma_i k_i = N$. The module herein means an operation represented by each block in FIG. 6F, and may be understood as an operation module in the encoder network. The encoder network may process the channel estimation result by using the operation module. In FIG. 6F, for example, a quantity of modules configured to process the channel estimation results is equal to a quantity of the channel estimation results (which is also M). Actually, the quantity of operation modules included in the encoder network is not limited. For example, the quantity of operation modules included in the encoder network is greater than or equal to 1. Outputs of M modules are combined, to obtain a total of N pieces of compression information, that is, $C_{n_1}$, $C_{n_2}$, $C_{n_3}$, . . . , and $C_{n_N}$. Each piece of compression information that is finally output is a real vector with [C', 1] dimensions, where C' represents a length of one piece of compression information, and may be obtained based on a requirement on feedback overheads.

Figure 6G:
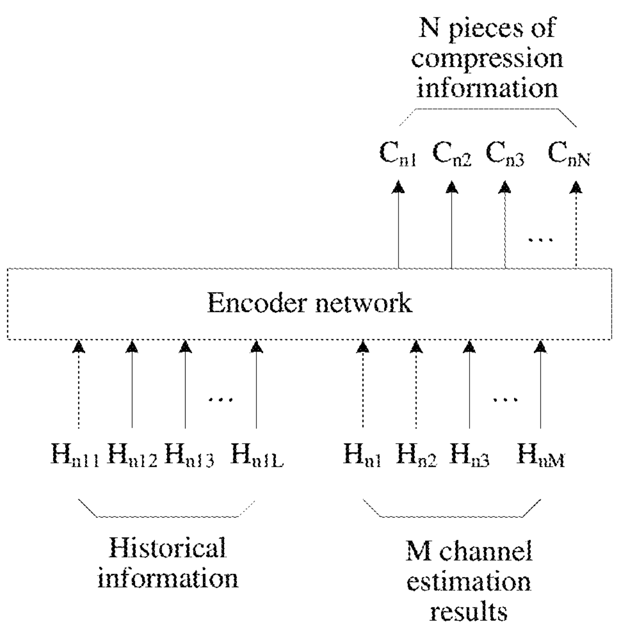

Further, FIG. 6G shows an example of an input and output scenario of an encoder network. FIG. 6G uses an example in which input information of an encoder network includes historical information. In FIG. 6G, $H_{n_1}$, $H_{n_2}$, $H_{n_3}$, . . . , and $H_{n_M}$ represent the M channel estimation results input to the encoder network, $H_{n_{11}}$, $H_{n_{12}}$, $H_{n_{13}}$, . . . , and $H_{n_{1L}}$ represent the L channel estimation results input to the encoder network, and $C_{n_1}$, $C_{n_2}$, $C_{n_3}$, . . . , and $C_{n_N}$ represent the N pieces of compression information output by the encoder network.

Figure 6H:
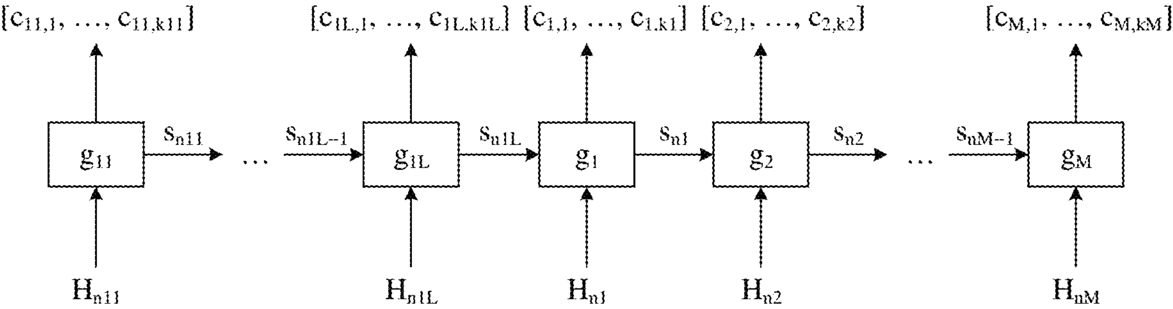

Optionally, for an implementation in which $H_{n_{11}}$, $H_{n_{12}}$, $H_{n_{13}}$, . . . , and $H_{n_{1L}}$, $H_{n_1}$, $H_{n_2}$, $H_{n_3}$, . . . , and $H_{n_M}$ are mapped to $C_{n_1}$, $C_{n_2}$, $C_{n_3}$, . . . , and $C_{n_N}$, refer to FIG. 6H. A calculation process involved in FIG. 6H may be expressed as follows:

$$[c_{11,1}, \ldots, c_{11,k_{11}}, s_{n_{11}}] = g_{11}(H_{n_{11}}, 0) \quad \text{(Formula 18)}$$

$$[c_{1i,1}, \ldots, c_{1i,k_{1i}}, s_{n_{1i}}] = g_{1i}(H_{n_{1i}}, s_{n_{1i-1}}),\ 2 \le i \le L \quad \text{(Formula 19)}$$

$$[c_{1,1}, \ldots, c_{1,k_1}, s_{n_1}] = g_1(H_{n_{11}}, s_{n_{1L}}) \quad \text{(Formula 20)}$$

$$[c_{i,1}, \ldots, c_{i,k_i}, s_{n_i}] = g_i(H_{n_i}, s_{n_{i-1}}),\ 2 \le i \le M \quad \text{(Formula 21)}$$

$[c_{i,1}, \ldots, c_{i,k_i}]$ represents $k_i(k_i \ge 0)$ outputs of an $i^{th}$ module, and $\Sigma_i k_i = N$. Outputs of M+L modules are combined, to obtain a total of N pieces of compression information, that is, $C_{n_1}$, $C_{n_2}$, $C_{n_3}$, . . . , and $C_{n_N}$. Each piece of compression information that is finally output is a real vector with [C', 1] dimensions.

In this case, the N pieces of compression information are obtained by performing joint compression on the M channel estimation results (or the M channel estimation results and the L channel estimation results), and can reflect a status of the downlink channels in the M slots. In addition, the downlink channels are correlated in time domain. The compression information can better reflect a related status of the downlink channels in time domain, so that the access network device can recover a more accurate downlink channel based on the compression information. In addition, because joint compression is performed on the M channel estimation results (or the M channel estimation results and the L channel estimation results), each piece of compression information does not need to represent all parameters of a channel estimation result participating in compression. For example, the N pieces of compression information may respectively correspond to different parameters of the M channel estimation results (or the M channel estimation results and the L channel estimation results), so that an information amount of the N pieces of compression information can be reduced, to reduce transmission overheads. In addition, in this case, the input information of the encoder network includes a plurality of channel estimation results, and the output information includes a plurality of pieces of compression information. Compared with a solution in which a single piece of compression information is output, the multiple-input multiple-output solution can simplify the structure of the encoder network.

S504: The UE sends the N pieces of compression information to the access network device. Correspondingly, the access network device receives the N pieces of compression information from the UE. The N pieces of compression information may be considered as CSI, or may be considered as PMIs.

Figure 7:
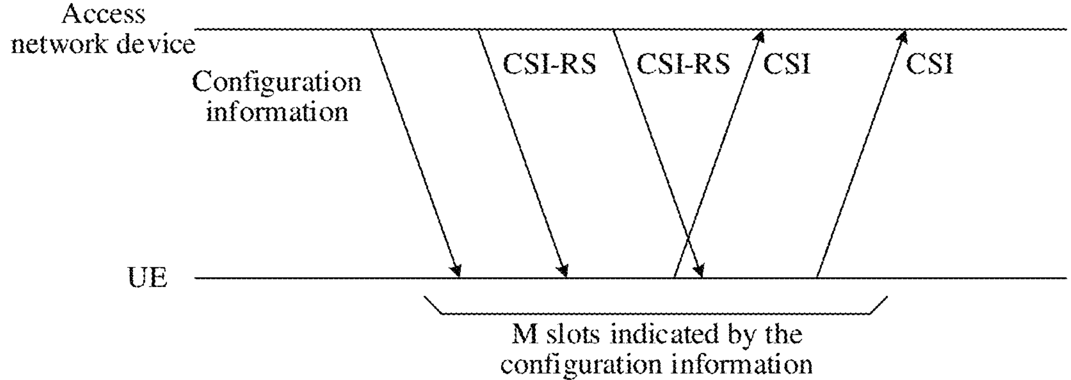
FIG. 7 is a diagram of a CSI feedback process.

FIG. 7 is a diagram of a CSI feedback process. In FIG. 7, an access network device sends configuration information to UE, and then sends a downlink reference signal to the UE. For example, the downlink reference signal is a CSI-RS. The UE may send compression information to the access network device for a plurality of times. For example, after performing channel estimation on downlink channels in M slots, the UE may send N pieces of compression information to the access network device. Then, the UE continues to perform channel estimation on the downlink channels in the M slots, and then sends the obtained compression information to the access network device. In FIG. 7, the UE sends the compression information to the access network device twice, or feeds back CSI twice. The CSI fed back by the UE to the access network device for a first time may include one or more of the following channel estimation results: a channel estimation result obtained by the UE based on a CSI-RS (the first CSI-RS from left to right in FIG. 7) received for the first time, a channel estimation result corresponding to a downlink channel before a downlink channel corresponding to the first CSI-RS, or a channel estimation result corresponding to a downlink channel after a downlink channel corresponding to the first CSI-RS. A slot in which the UE feeds back the CSI to the access network device for the first time is later than a slot in which the UE receives the CSI-RS for the first time (or later than a slot in which the access network device delivers the CSI-RS for the first time). A slot in which the UE feeds back the CSI to the access network device for the first time may be earlier than or later than a slot in which the UE receives the CSI-RS for the second time (or earlier than or later than a slot in which the access network device delivers the CSI-RS for the second time). FIG. 7 uses a slot earlier than a slot in which the UE receives the CSI-RS for the second time as an example. Similarly, the CSI fed back by the UE to the access network device for a $k^{th}$ time may include one or more of the following channel estimation results: a channel estimation result obtained by the UE based on a CSI-RS received for the $k^{th}$ time, a channel estimation result corresponding to a downlink channel before a downlink channel corresponding to a CSI-RS received for the $k^{th}$ time, or a channel estimation result corresponding to a downlink channel after a downlink channel corresponding to a CSI-RS received for the $k^{th}$ time. A slot in which the UE feeds back the CSI to the access network device for the $k^{th}$ time is later than a slot in which the UE receives the CSI-RS for the $k^{th}$ time (or later than a slot in which the access network device delivers the CSI-RS for the $k^{th}$ time). A slot in which the UE feeds back the CSI to the access network device for the $k^{th}$ time may be earlier than or later than a slot in which the UE receives the CSI-RS for a $(k+1)^{th}$ time (or earlier than or later than a slot in which the access network device delivers the CSI-RS for a $(k+1)^{th}$ time). In addition, it can be learned from FIG. 7 that the M slots indicated by the configuration information may include a moment at which the configuration information is received, and may further include a moment before the configuration information is received and a moment after the configuration information is received.

S505: The access network device recovers the N pieces of compression information, to obtain K pieces of recovery information. The K pieces of recovery information are information about a downlink channel in the M slots, that is, the K pieces of recovery information can represent the downlink channel in the M slots. K is a positive integer. For example, K may be equal to 1, or may be greater than 1. If K is greater than 1, K may be equal to N, or may be greater than N or less than N. K may be equal to M, or may be greater than M or less than M. K may be equal to M+L, or may be greater than M+L or less than M+L. That is, a quantity of channel estimation results input by the UE to the encoder network may be equal to or not equal to a quantity of pieces of reply information output by a decoder network. This is more flexible.

In this disclosure, the UE may perform joint compression on the plurality of channel estimation results by using the encoder network, and the access network device may recover the N pieces of compression information by using the corresponding decoder network. Therefore, the access network device needs to first determine a used decoder network. If the access network device sends the first indication information to the UE to indicate a reference encoder network, the access network device may determine a reference decoder network corresponding to the reference encoder network. Alternatively, if the UE sends the second indication information to the access network device to indicate a reference encoder network, the access network device may determine a reference decoder network corresponding to the reference encoder network. Alternatively, if the UE sends the second indication information to the access network device to indicate a reference network, the access network device may determine a reference decoder network included in the reference network.

After determining the reference decoder network, the access network device may directly use the determined reference decoder network. In other words, the reference decoder network is a decoder network finally used by the access network device. Alternatively, after determining the reference decoder network, the access network device does not directly use the reference decoder network, but a characteristic of a decoder network finally used by the access network device may be determined based on a characteristic of the reference decoder network. For example, an input dimension of the decoder network used by the access network device may be determined based on an input dimension of the reference decoder network. For example, the input dimension of the decoder network used by the access network device is equal to the input dimension of the reference decoder network. Similarly, for example, an output dimension of the decoder network used by the access network device may also be determined based on an output dimension of the reference decoder network. For example, the output dimension of the decoder network used by the access network device is equal to the output dimension of the reference decoder network. For example, when the input of the decoder network used by the access network device is the same as the input of the reference decoder network, a difference between the output of the decoder network used by the access network device and the output of the reference decoder network is less than a threshold.

After determining the decoder network, the access network device may recover the N pieces of compression information based on the decoder network. For example, the access network device inputs the N pieces of compression information into the decoder network, and the decoder network outputs the K pieces of recovery information. Each of the K pieces of recovery information corresponds to some or all of the N pieces of compression information. Compression information corresponding to different pieces of recovery information may be the same, or may be different or not completely the same. Different pieces of recovery information may correspond to a same parameter of same compression information, or different pieces of recovery information may correspond to different parameters of same compression information, or different pieces of recovery information may correspond to parameters that are not completely the same of same compression information. That one piece of recovery information corresponds to one piece of compression information may be understood as that the recovery information reflects a characteristic of the compression information, or that a process of generating the recovery information is related to the compression information, or that the recovery information corresponds to all or some parameters of the compression information.

For example, N=3, the N pieces of compression information are compression information 1, compression information 2, and compression information 3, and the three pieces of compression information all correspond to parameters A to E; and K=3, the K pieces of recovery information is recovery information 1, recovery information 2, and recovery information 3. The recovery information 1 may reflect parameters A and B corresponding to the compression information 1, parameters A and C corresponding to the compression information 2, and parameters D and E corresponding to the compression information 3. The recovery information 2 may reflect parameters A, B, and C corresponding to the compression information 1, parameters A and C corresponding to the compression information 2, and parameters C and E corresponding to the compression information 3. The recovery information 3 may reflect parameters D and E corresponding to the compression information 1, parameters B, D, and E corresponding to the compression information 2, and parameters A and B corresponding to the compression information 3. In this case, different pieces of recovery information correspond to a same piece of compression information, and parameters corresponding to different pieces of recovery information include the following several cases. Different pieces of recovery information may correspond to same parameters of a same piece of compression information (for example, the recovery information 1 corresponds to parameters A and C of the compression information 2, and the recovery information 2 also corresponds to the parameters A and C of the compression information 1). Different pieces of recovery information may correspond to different parameters of a same piece of compression information (for example, the recovery information 1 corresponds to parameters A and B of the compression information 1, and the recovery information 3 corresponds to parameters D and E of the compression information 1). Different pieces of recovery information may also correspond to parameters that are not completely the same of a same piece of compression information (for example, the recovery information 1 corresponds to parameters A and B of the compression information 1, and the recovery information 2 corresponds to parameters A, B, and C of the compression information 1). In this example, for example, parameters corresponding to the N pieces of compression information are all the same (that is, all the three pieces of compression information correspond to the parameters A to E). Actually, parameters corresponding to different pieces of compression information may be different or not completely the same. This is not limited herein. In addition, in this example, for example, parameters corresponding to the K pieces of recovery information are all the same. Actually, parameters corresponding to different pieces of recovery information may also be different or not completely the same. For example, K=2, recovery information 1 may correspond to M parameters A of the N pieces of compression information, and recovery information 2 no longer corresponds to the parameter A.

Figure 8A:
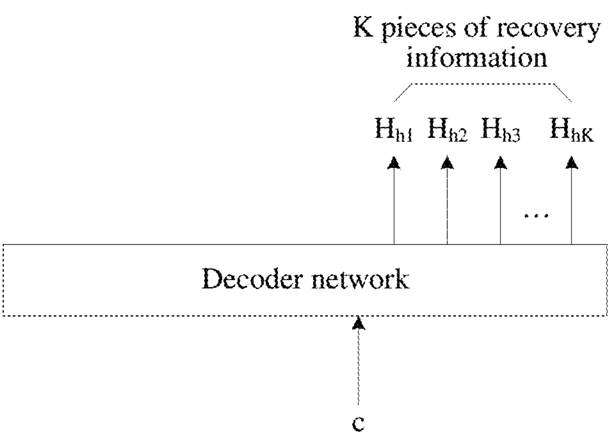
FIG. 8A to FIG. 8D are diagrams of several input and output scenarios of a decoder network.

FIG. 8A shows an example of input/output information of a decoder network when N=1. In FIG. 8A, c represents compression information input by the decoder network, and $H_{h_1}$, $H_{h_2}$, $H_{h_3}$, . . . , and $H_{h_K}$ represent K pieces of recovery information output by the decoder network.

Figure 8B:
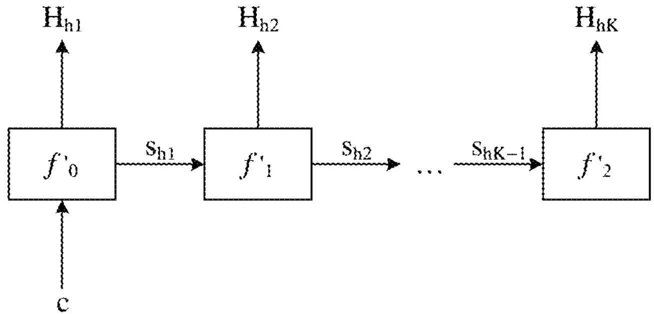

The compression information input by the network is expressed as described above. Optionally, for an implementation in which c is mapped to $H_{h_1}$, $H_{h_2}$, $H_{h_3}$, . . . , and $H_{h_K}$, refer to FIG. 8B. A calculation process involved in FIG. 8B is as follows:

$$[H_{h_1}, s_{h_1}] = f'_0(c) \quad \text{(Formula 22)}$$

$$[H_{h_i}, s_{h_i}] = f'_1(s_{h_{i-1}}),\ 2 \le i \le K-1 \quad \text{(Formula 23)}$$

$$[H_{h_k}] = f'_2(s_{h_{K-1}}) \quad \text{(Formula 24)}$$

Figure 8C:
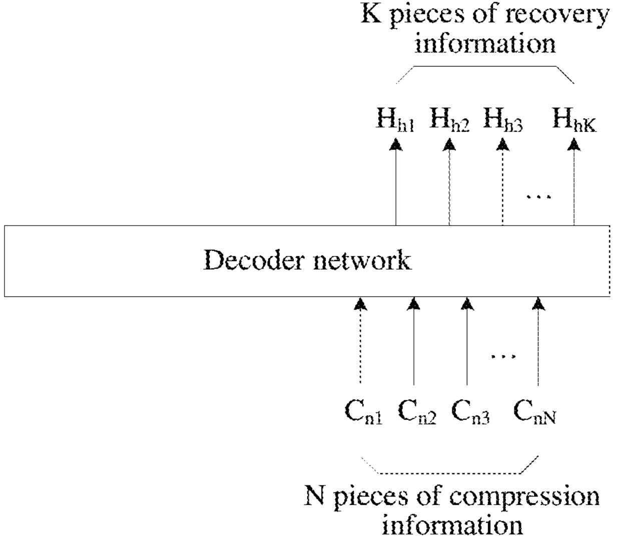

Further, FIG. 8C shows an example of input/output information of a decoder network when N>1. In FIG. 8C, $C_{n_1}$, $C_{n_2}$, $C_{n_3}$, . . . , and $C_{n_N}$ represent N pieces of compression information input by the decoder network, and $H_{h_1}$, $H_{h_2}$, $H_{h_3}$, . . . , and $H_{h_K}$ represent K pieces of recovery information output by the decoder network.

Figure 8D:
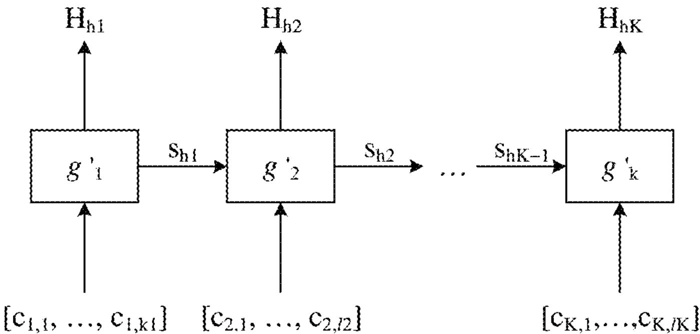

The compression information input by the network is expressed as described above. Optionally, for an implementation in which $C_{n_1}$, $C_{n_2}$, $C_{n_3}$, . . . , and $C_{n_N}$ are mapped to $H_{h_1}$, $H_{h_2}$, $H_{h_3}$, . . . , and $H_{h_K}$, refer to FIG. 8D. For example, the N pieces of compression information may be divided into K groups, where an $i^{th}$ group includes $l_i$ pieces of compression information, and the K groups of compression information may be input to K calculation modules in the decoder network, so that K pieces of recovery information output by the K calculation modules may be obtained. A calculation process involved in FIG. 8D is as follows:

$$[H_{h_1}, s_{h_1}] = g'_1([c_{1,1}, \ldots, c_{1,l_1}]) \quad \text{(Formula 25)}$$

$$[H_{h_i}, s_{h_i}] = g'_i([c_{i,1}, \ldots, c_{i,l_i}], s_{h_{i-1}}),\ 2 \le i \le K-1 \quad \text{(Formula 26)}$$

$$[H_{h_K}] = g'_K([c_{K,1}, \ldots, c_{K,l_K}], s_{h_{K-1}}) \quad \text{(Formula 27)}$$

The K pieces of recovery information obtained by the decoder network may be considered as CSI, or as PMIs, or as information having a similar function as CSI or a PMI. Optionally, the decoder network may further process the K pieces of recovery information, to obtain recovered downlink channel information. In other words, the access network device may obtain the recovered downlink channel information based on the K pieces of recovery information. The downlink channel information is, for example, a downlink channel matrix, or a parameter of a downlink channel matrix (for example, parameters such as a weight of a downlink channel matrix).

Sampling points corresponding to the K pieces of recovery information are located in the M slots, and sampling points corresponding to the N pieces of compression information (or sampling points corresponding to the M channel estimation results) are also located in the M slots. However, a quantity of sampling points corresponding to the K pieces of recovery information may be equal to or not equal to a quantity of sampling points corresponding to the N pieces of compression information.

In addition, time-domain locations of sampling points corresponding to the K pieces of recovery information may be the same as, or different from or not completely the same as time-domain locations of sampling points corresponding to the N pieces of compression information. For example, the K pieces of recovery information correspond to three sampling points, and time-domain locations are respectively T1, T2, and T3. The N pieces of compression information correspond to three sampling points, and time-domain locations are respectively T1, T4, and T3. It can be learned that the time-domain locations of the sampling points corresponding to the K pieces of recovery information are not completely the same as the time-domain locations of the sampling points corresponding to the N pieces of compression information. For another example, the K pieces of recovery information correspond to two sampling points, and time-domain locations are respectively T1 and T2. The N pieces of compression information correspond to three sampling points, and time-domain locations are respectively T4, T5, and T6. It can be learned that the time-domain locations of the sampling points corresponding to the K pieces of recovery information are different from the time-domain locations of the sampling points corresponding to the N pieces of compression information. For another example, the K pieces of recovery information correspond to three sampling points, and time-domain locations are respectively T1, T2, and T3. The N pieces of compression information correspond to three sampling points, and time-domain locations are respectively T1, T2, and T3. It can be learned that the time-domain locations of the sampling points corresponding to the K pieces of recovery information are the same as the time-domain locations of the sampling points corresponding to the N pieces of compression information.

In other words, the time-domain locations of the sampling points corresponding to the K pieces of recovery information are located in the M slots, and the quantity of the sampling points corresponding to the K pieces of recovery information, the time-domain locations in the M slots, and the like are not limited. In this way, for the access network device, a recovery process may be flexible.

Optionally, after obtaining the downlink channel information based on the K pieces of recovery information, the access network device may determine, based on the downlink channel information, one or more of pieces of information such as a quantity of streams used when data is sent to the UE, a modulation order used when data is sent to the UE, or a code rate of a channel (for example, a physical downlink control channel (physical downlink control channel, PDCCH)) carrying the data. In addition, the access network device may further determine, based on the downlink channel information, a precoding matrix used when data is sent to the UE, and the like. Alternatively, the access network device does not recover the downlink channel information based on the K pieces of recovery information, but directly uses the K pieces of recovery information. In this case, the access network device may determine, based on the K pieces of recovery information, one or more of pieces of information such as a quantity of streams used when data is sent to the UE, a modulation order used when data is sent to the UE, or a coding rate of a channel carrying the data. In addition, the access network device may further determine, based on the K pieces of recovery information, a precoding matrix used when data is sent to the UE, and the like.

In this disclosure, the UE may perform channel estimation on the downlink channels in the M slots, perform joint compression on the obtained channel estimation results, and report the channel estimation results to the access network device. Because joint compression is performed, correlation between downlink channels in different slots is fully utilized, and the access network device recovers N pieces of compression information obtained through joint compression, so that a more accurate and effective downlink channel information can be obtained. In addition, because joint compression is performed, the N pieces of compression information may complement each other. For example, different pieces of compression information may correspond to different parameters, to reduce redundant information and correspondingly reduce transmission overheads. In addition, during joint compression, in addition to the M channel estimation results, historical information may be further considered, so that the compression information can reflect characteristics of downlink channels in more slots, and the access network device can recover a more accurate downlink channel matrix.

A communication apparatus provided in this disclosure is described according to the foregoing method embodiments.

This disclosure provides a communication apparatus. The communication apparatus includes, for example, a processing unit and a transceiver unit (or referred to as a communication unit). The processing unit may be configured to implement a processing function of the UE in embodiment shown in FIG. 5, and the transceiver unit may be configured to implement all or some sending and receiving functions of the UE in embodiment shown in FIG. 5. Alternatively, the processing unit may be configured to implement a processing function implemented by the access network device in embodiment shown in FIG. 5, and the transceiver unit may be configured to implement all or some sending and receiving functions of the access network device in embodiment shown in FIG. 5.

Optionally, the processing unit and/or the transceiver unit may be implemented by using a virtual module. For example, the processing unit may be implemented by using a software functional unit or a virtual apparatus, and the transceiver unit may be implemented by using a software functional unit or a virtual apparatus. Alternatively, the processing unit and/or the transceiver unit may be implemented by using a physical apparatus (for example, a circuit system and/or a processor). The following describes a case in which the processing unit and the transceiver unit are implemented by using a physical apparatus.

Figure 9:
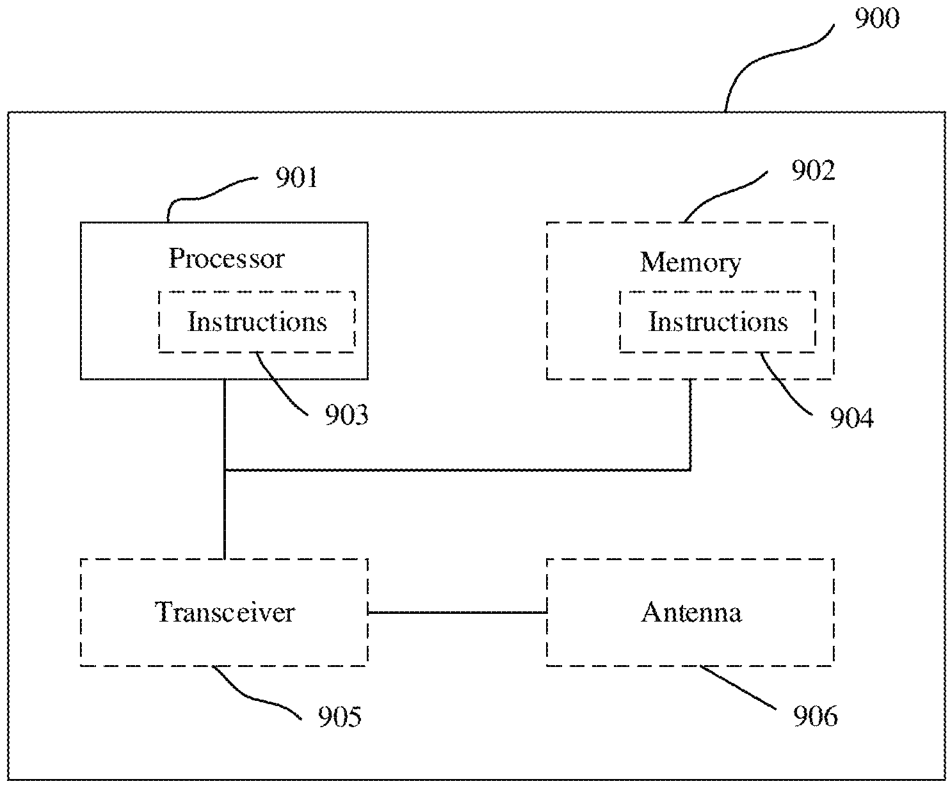
FIG. 9 is a schematic block diagram of a communication apparatus.

FIG. 9 is a diagram of a structure of a communication apparatus according to this disclosure. The communication apparatus 900 may be the UE in embodiment shown in FIG. 5, a circuit system of the UE, a circuit system that can be used in the UE, or the like, and is configured to implement the method corresponding to the UE in the foregoing method embodiment. Alternatively, the communication apparatus 900 may be the access network device in embodiment shown in FIG. 5, a circuit system of the access network device, a circuit system that can be used in the access network device, or the like, and is configured to implement the method corresponding to the access network device in the foregoing method embodiment. For a specific function, refer to the descriptions in the foregoing method embodiment. For example, the circuit system is a chip system.

The communication apparatus 900 includes one or more processors 901. The processor 901 may implement a specific control function. The processor 901 may be a general-purpose processor, a dedicated processor, or the like. For example, the processor 901 includes a baseband processor, a central processing unit, and the like. The baseband processor may be configured to process a communication protocol and communication data. The central processing unit may be configured to control the communication apparatus 900, execute a software program, and/or process data. Different processors may be independent components, or may be disposed in one or more processing circuits, for example, integrated in one or more application-specific integrated circuits.

Optionally, the communication apparatus 900 includes one or more memories 902, configured to store instructions 904. The instructions 904 may be run on the processor, so that the communication apparatus 900 is enabled to perform the method described in the foregoing method embodiment. Optionally, the memory 902 may further store data. The processor and the memory may be separately disposed, or may be integrated together.

Optionally, the communication apparatus 900 may store instructions 903 (which may also be referred to as code or a program sometimes), and the instructions 903 may be run on the processor, so that the communication apparatus 900 is enabled to perform the method described in the foregoing embodiment. The processor 901 may store data.

For example, the processing unit is implemented by using the one or more processors 901, or the processing unit is implemented by using the one or more processors 901 and the one or more memories 902, or the processing unit is implemented by using the one or more processors 901, the one or more memories 902, and the instructions 903.

Optionally, the communication apparatus 900 may further include a transceiver 905 and an antenna 906. The transceiver 905 may be referred to as a transceiver unit, a transceiver, a transceiver circuit, a transceiver machine, an input/output interface, or the like, and is configured to implement a transceiver function of the communication apparatus 900 by using the antenna 906. For example, the transceiver unit is implemented by using the transceiver 905, or the transceiver unit is implemented by using the transceiver 905 and the antenna 906.

Optionally, the communication apparatus 900 may further include one or more of the following components: a wireless communication module, an audio module, an external memory interface, an internal memory, a universal serial bus (universal serial bus, USB) interface, a power management module, an antenna, a speaker, a microphone, an input/output module, a sensor module, a motor, a camera, a display, or the like. It may be understood that in some embodiments, the communication apparatus 900 may include more or fewer components, or some components are integrated, or some components are split. The components may be implemented by hardware, software, or a combination of software and hardware.

The processor 901 and the transceiver 905 described in this disclosure may be implemented on an integrated circuit (integrated circuit, IC), an analog IC, a radio frequency integrated circuit (radio frequency integrated circuit, RFID), a mixed signal IC, an application-specific integrated circuit (application-specific integrated circuit, ASIC), a printed circuit board (printed circuit board, PCB), an electronic device, or the like. The communication apparatus described in this specification may be an independent device (for example, an independent integrated circuit or a mobile phone), or may be a part of a large device (for example, a module that may be embedded in another device). For details, refer to descriptions of the UE and the access network device in the foregoing embodiments. Details are not described herein again.

This disclosure provides a terminal device, and the terminal device may be used in the foregoing embodiments. The terminal device includes a corresponding means (means), a unit, and/or a circuit for implementing the function of the UE in embodiment shown in FIG. 5. For example, the terminal device includes a transceiver module (or referred to as a transceiver unit), configured to support the terminal device in implementing a transceiver function, and a processing module (or referred to as a processing unit), configured to support the terminal device in processing a signal.

This disclosure further provides an access network device, and the access network device may be used in the foregoing embodiments. The access network device includes a corresponding means (means), unit, and/or circuit for implementing the function of the access network device in embodiment shown in FIG. 5. For example, the access network device includes a transceiver module (or referred to as a transceiver unit), configured to support the access network device in implementing a transceiver function, and a processing module (or referred to as a processing unit), configured to support the access network device in processing a signal.

All or some of the technical solutions provided in this disclosure may be implemented by using software, hardware, firmware, or any combination thereof. When software is used to implement embodiments, all or some of embodiments may be implemented in a form of a computer program product. The computer program product includes one or more computer instructions. When the computer program instructions are loaded and executed on a computer, the procedure or functions according to this disclosure are all or partially generated. The computer may be a general-purpose computer, a dedicated computer, a computer network, an access network device, a terminal device, an AI node, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (digital subscriber line, DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk drive, or a magnetic tape), an optical medium (for example, a digital video disc (digital video disc, DVD)), a semiconductor medium, or the like.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

The invention claimed is:

1. A communication method, comprising:

obtaining M channel estimation results, wherein the M channel estimation results correspond to M time units, and M is an integer greater than 1;

performing joint compression on the M channel estimation results by using an encoder network, to obtain N pieces of compression information, wherein N is a positive integer; and sending the N pieces of compression information to an access network device, wherein the performing joint compression on the M channel estimation results by using the encoder network, to obtain the N pieces of compression information comprises:

performing joint compression on the M channel estimation results and historical information by using the encoder network, to obtain the N pieces of compression information, wherein the historical information comprises a channel estimation result corresponding to a time unit before the M time units.

2. The method according to claim 1, wherein the M channel estimation results comprise a first channel estimation result, and the first channel estimation result is one of the following:

a channel estimation result obtained by performing measurement based on a received downlink reference signal;

a processing result obtained by processing the channel estimation result obtained by performing measurement based on the received downlink reference signal; or a channel estimation result obtained through prediction.

3. The method according to claim 1, wherein each of the N pieces of compression information corresponds to the M channel estimation results.

4. The method according to claim 1, wherein each of the N pieces of compression information corresponds to the M channel estimation results and the historical information.

5. The method according to claim 1, wherein the method further comprises:

receiving configuration information from the access network device, wherein the configuration information is used to configure the M time units.

6. The method according to claim 5, wherein the configuration information comprises one or more of the following:

a start time-domain location of the M time units;

an end time-domain location of the M time units;

duration of the M time units;

numbers of the M time units;

a time-domain location of a first sampling point in the M time units;

a sampling period in the M time units;

a quantity of sampling points in the M time units; or time-domain locations of sampling points in the M time units.

7. The method according to claim 1, wherein the method further comprises:

receiving first indication information from the access network device, wherein the first indication information indicates parameter information of a reference encoder network or an index of the reference encoder network; or sending second indication information to the access network device, wherein the second indication information indicates parameter information of the reference encoder network or ag the index of the reference encoder network, wherein the reference encoder network is used to determine the encoder network.

8. A communication method, comprising:

receiving N pieces of compression information from a terminal device, wherein N is a positive integer; and recovering the N pieces of compression information by using a decoder network, to obtain K pieces of recovery information, wherein the K pieces of recovery information are downlink channel information in M time units, K is a positive integer, and M is an integer greater than 1, wherein the received N pieces of compression information is obtained from joint compression on M channel estimation results and historical information by using an encoder network, and wherein the historical information comprises a channel estimation result corresponding to a time unit before the M time units.

9. The method according to claim 8, wherein each of the K pieces of recovery information corresponds to the N pieces of compression information.

10. The method according to claim 8, wherein the method further comprises:

sending configuration information to the terminal device, wherein the configuration information is used to configure the M time units.

11. The method according to claim 10, wherein the configuration information comprises one or more of the following:

a start time-domain location of the M time units;

an end time-domain location of the M time units;

duration of the M time units;

numbers of the M time units;

a time-domain location of a first sampling point in the M time units;

a sampling period in the M time units;

a quantity of sampling points in the M time units; or time-domain locations of sampling points in the M time units.

12. The method according to claim 8, wherein the method further comprises:

sending first indication information to the terminal device, wherein the first indication information indicates parameter information of a reference encoder network or an index of the reference encoder network; or receiving second indication information from the terminal device, wherein the second indication information indicates parameter information of the reference encoder network selected by the terminal device or the index of the reference encoder network selected by the terminal device, wherein the reference encoder network and a reference decoder network belong to a same reference network, and the reference decoder network is used to determine the decoder network.

13. A communication apparatus, comprising a processor and a memory, wherein the memory is coupled to the processor, and the processor is configured to execute instructions stored in the memory, to cause the apparatus to perform the following:

obtaining M channel estimation results, wherein the M channel estimation results correspond to M time units, and M is an integer greater than 1;

performing joint compression on the M channel estimation results by using an encoder network, to obtain N pieces of compression information, wherein N is a positive integer; and sending the N pieces of compression information to an access network device, wherein the performing joint compression on the M channel estimation results by using the encoder network, to obtain the N pieces of compression information comprises:

performing joint compression on the M channel estimation results and historical information by using the encoder network, to obtain the N pieces of compression information, wherein the historical information comprises a channel estimation result corresponding to a time unit before the M time units.

14. The apparatus according to claim 13, wherein the M channel estimation results comprise a first channel estimation result, and the first channel estimation result is one of the following:

a channel estimation result obtained by performing measurement based on a received downlink reference signal;

a processing result obtained by processing the channel estimation result obtained by performing measurement based on the received downlink reference signal; or a channel estimation result obtained through prediction.

15. The apparatus according to claim 13, wherein each of the N pieces of compression information corresponds to the M channel estimation results.

16. The apparatus according to claim 13, wherein each of the N pieces of compression information corresponds to the M channel estimation results and the historical information.

17. The apparatus according to claim 13, wherein the apparatus is further configured to execute instructions stored in the memory, to cause the apparatus to perform the following:

receiving configuration information from the access network device, wherein the configuration information is used to configure the M time units.

18. The apparatus according to claim 17, wherein the configuration information comprises one or more of the following:

a start time-domain location of the M time units;

an end time-domain location of the M time units;

duration of the M time units;

numbers of the M time units;

a time-domain location of a first sampling point in the M time units;

a sampling period in the M time units;

a quantity of sampling points in the M time units; or time-domain locations of sampling points in the M time units.

* * * * *